US012581818B2

(12) United States Patent (10) Patent No.: US 12,581,818 B2

Luo (45) Date of Patent: Mar. 17, 2026

(54) DISPLAY PANEL AND DISPLAY APPARATUS

(71) Applicant: Wuhan Tianma Micro-Electronics Co., Ltd., Wuhan (CN)

(72) Inventor: Yaqin Luo, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 389 days.

(21) Appl. No.: 18/214,254

(22) Filed: Jun. 26, 2023

(65) Prior Publication Data

US 2024/0315096 A1 Sep. 19, 2024

(30) Foreign Application Priority Data

Mar. 14, 2023 (CN) .......................... 202310245036.5

(51) Int. Cl.
H10K 59/131 (2023.01)
G09G 3/3208 (2016.01)
H10K 59/121 (2023.01)
H10K 59/80 (2023.01)
(Continued)

(52) U.S. Cl.
CPC ......... H10K 59/131 (2023.02); G09G 3/3208 (2013.01); H10K 59/1216 (2023.02); H10K 59/8794 (2023.02); H10K 77/111 (2023.02); G09G 2300/0842 (2013.01);
(Continued)

(58) Field of Classification Search
CPC ............. H10K 59/131; H10K 59/1216; H10K 59/8794; H10K 77/111; H10K 2102/311;

G09G 3/3208; G09G 2300/0842; G09G 2320/041; G09G 2320/043; Y02E 10/549; G09F 9/33; G09F 9/335
See application file for complete search history.

(56) References Cited

U.S. PATENT DOCUMENTS 11,574,983 B2 * 2/2023 Gunji ........................ G09F 9/00
2003/0067458 A1 * 4/2003 Anzai .................... H10D 86/00
257/E27.111
2017/0054102 A1 2/2017 Hong et al.
(Continued)

FOREIGN PATENT DOCUMENTS

CN 107331294 A 11/2017
CN 110444665 A 11/2019
CN 113053979 A 6/2021

*Primary Examiner* — J.E. Schoenholtz
(74) *Attorney, Agent, or Firm* — Anova Law Group, PLLC

(57) ABSTRACT

A display panel and a display apparatus are provided in the present disclosure. The display panel includes a display region and a non-display region, where the non-display region includes a first region, a bending region and a second region; the second region includes a binding region; the display region includes a first display region; and the binding region is at least partially overlapped with the first display region. The display panel further includes a plurality of sub-pixels, including pixel circuits and light-emitting elements, and first signal lines electrically connected to the pixel circuits. The light-emitting elements include a first-color light-emitting element; and at least in the first display region, an orthographic projection of a first signal line on a plane of the display panel is at a periphery of an orthographic projection of an anode of the first-color light-emitting element on the plane of the display panel.

18 Claims, 26 Drawing Sheets

(51) Int. Cl.
    *H10K 77/10*        (2023.01)
    *H10K 102/00*     (2023.01)

(52) U.S. Cl.
    CPC . *G09G 2320/041* (2013.01); *G09G 2320/043*
            (2013.01); *H10K 2102/311* (2023.02)

(56)           References Cited

U.S. PATENT DOCUMENTS

| 2021/0057512 | A1* | 2/2021 | Gunji | ..................... | H10K 50/00 |
| 2022/0005834 | A1* | 1/2022 | Lee | ......................... | H10D 86/60 |
| 2022/0376216 | A1* | 11/2022 | Zhao | ....................... | H10K 59/87 |
| 2024/0032382 | A1* | 1/2024 | Kim | ......................... | H10K 50/84 |
| 2024/0334741 | A1* | 10/2024 | Miyamoto | ................ | G09F 9/30 |

* cited by examiner

200

100

DISPLAY PANEL AND DISPLAY APPARATUS

CROSS-REFERENCE TO RELATED APPLICATION

The present disclosure claims the priority of Chinese Patent Application No. 202310245036.5, filed on Mar. 14, 2023, the content of which is incorporated herein by reference in its entirety.

TECHNICAL FIELD

The present disclosure generally relates to the field of display technology and, more particularly, relates to a display panel and a display apparatus.

BACKGROUND

With the development of display technology, display apparatuses (such as mobile phones, tablets, TVs, wearable bracelets and the like) have been widely used. Heat dissipation is an important issue of display apparatuses. If high heat amount generated in the display apparatus directly acts on the light-emitting element in the display apparatus, high temperature environment is highly likely to result in cleaving of the light-emitting material in the light-emitting element, which may affect the display effect of the display apparatus and reduce the service life of the display panel.

SUMMARY

One aspect of the present disclosure provides a display panel. The display panel includes a display region and a non-display region, where the non-display region includes a first region, a bending region and a second region which are on a same side of the display region; the bending region is between the first region and the second region; the second region includes a binding region; the display region includes a first display region; along a first direction, the binding region is at least partially overlapped with the first display region; and the first direction is a thickness direction of the display panel. The display panel further includes a plurality of sub-pixels, including pixel circuits and light-emitting elements which are electrically connected to each other; and first signal lines electrically connected to the pixel circuits. A light-emitting element includes an anode, a light-emitting layer, and a cathode which are arranged along the first direction; the light-emitting elements include a first-color light-emitting element; and at least in the first display region, an orthographic projection of a first signal line on a plane of the display panel is at a periphery of an orthographic projection of an anode of the first-color light-emitting element on the plane of the display panel.

Another aspect of the present disclosure provides a display apparatus including a display panel. The display panel includes a display region and a non-display region, where the non-display region includes a first region, a bending region and a second region which are on a same side of the display region; the bending region is between the first region and the second region; the second region includes a binding region; the display region includes a first display region; along a first direction, the binding region is at least partially overlapped with the first display region; and the first direction is a thickness direction of the display panel. The display panel further includes a plurality of sub-pixels, including pixel circuits and light-emitting elements which are electrically connected to each other; and first signal lines electrically connected to the pixel circuits. A light-emitting element includes an anode, a light-emitting layer, and a cathode which are arranged along the first direction; the light-emitting elements include a first-color light-emitting element; and at least in the first display region, an orthographic projection of a first signal line on a plane of the display panel is at a periphery of an orthographic projection of an anode of the first-color light-emitting element on the plane of the display panel.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

Figure 1:
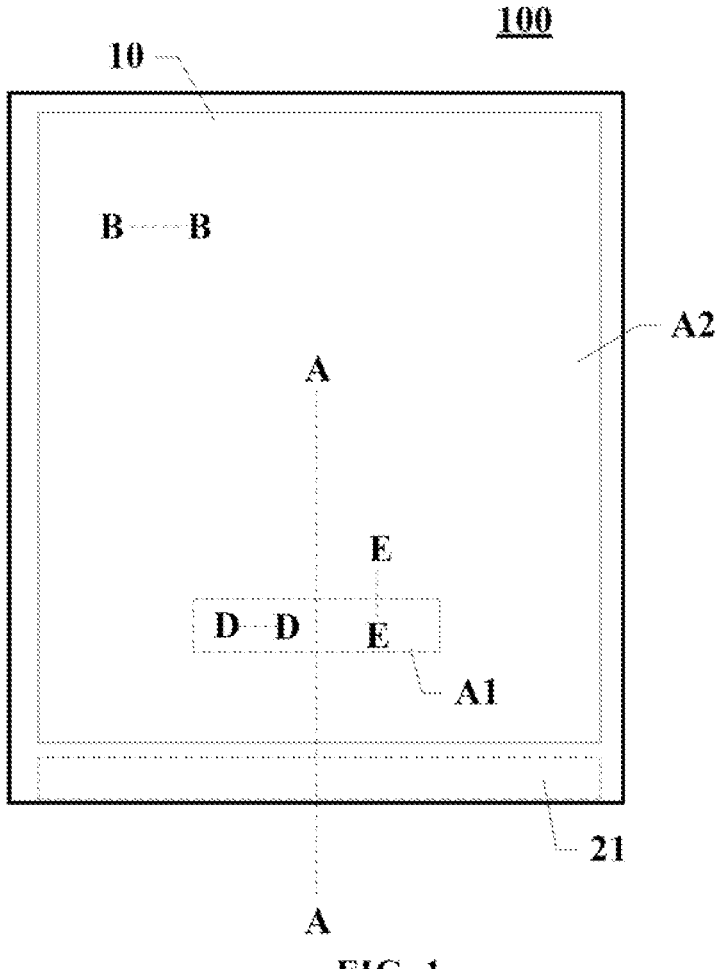
FIG. 1 illustrates a top view of a display panel according to various embodiments of the present disclosure.

Various exemplary embodiments of the present disclosure are described in detail with reference to accompanying drawings. It should be noted that unless specifically stated otherwise, relative arrangement of assemblies and steps, numerical expressions and values described in those embodiments may not limit the scope of the present disclosure.

Following description of at least one exemplary embodiment may be merely illustrative and may not be configured to limit the present disclosure and its application or use.

The technologies, methods and apparatuses known to those skilled in the art may not be discussed in detail, but where appropriate, the technologies, methods and apparatuses should be considered as a part of the present disclosure.

In all examples shown and discussed herein, any specific value should be interpreted as merely exemplary, rather than as a limitation. Therefore, other examples in exemplary embodiment may have different values.

It is apparent to those skilled in the art that various modifications and variations may be made in the present disclosure without departing from the spirit or scope of the present disclosure. Therefore, the present disclosure is intended to cover modifications and variations of the present disclosure falling within the scope of corresponding claims (technical solutions to be protected) and their equivalents. It should be noted that, implementation manners provided in embodiment of the present disclosure may be combined with each other if there is no contradiction.

It should be noted that similar reference numerals and letters are configured to indicate similar items in following drawings. Therefore, once an item is defined in one drawing, it does not need to be further discussed in subsequent drawings.

The present disclosure provides a display panel, including a display region and a non-display region. The non-display region may include a first region, a bending region and a second region located on a same side of the display region, where the bending region may be between the first region and the second region, and the second region may include a binding region; the display region may include a first display region, where along a first direction, the binding region may be at least partially overlapped with the first display region, and the first direction may be the thickness direction of the display panel; the display panel may further include a plurality of light-emitting elements, where the light-emitting element may include an connected pixel circuit and a light-emitting element which are electrically connected to each other; the display panel may further include a first signal line electrically connected to the pixel circuit; the light-emitting element may include an anode, a light-emitting layer, and a cathode which are arranged along a first direction; the light-emitting element may include a first-color light-emitting element; and at least in the first display region, the orthographic projection of the first signal line on the plane of the display panel may be at the periphery of the orthographic projection of the anode of the first-color light-emitting element on the plane of the display panel. In the first display region, by arranging the first signal line on the periphery of the first-color light-emitting element, the heat generated by the first signal line may be prevented from directly acting on the light-emitting layer of the first-color light-emitting element, which may be beneficial for reducing the impact on the light-emitting layer in the first-color light-emitting element when the first signal line is seriously heated and avoid the material cleaving problem caused by the light-emitting layer in the first-color light-emitting element being exposed to high temperature, thereby avoiding the problem of affecting the display effect and service life due to material cleaving in the light-emitting layer.

The above is the core idea of the present disclosure, and the technical solutions in embodiments of the present disclosure are clearly and completely described below in conjunction with accompanying drawings in embodiments of the present disclosure. Based on embodiments of the present disclosure, all other embodiments obtained by those skilled in the art without creative work belong to the protection scope of embodiments of the present disclosure.

Figure 2:
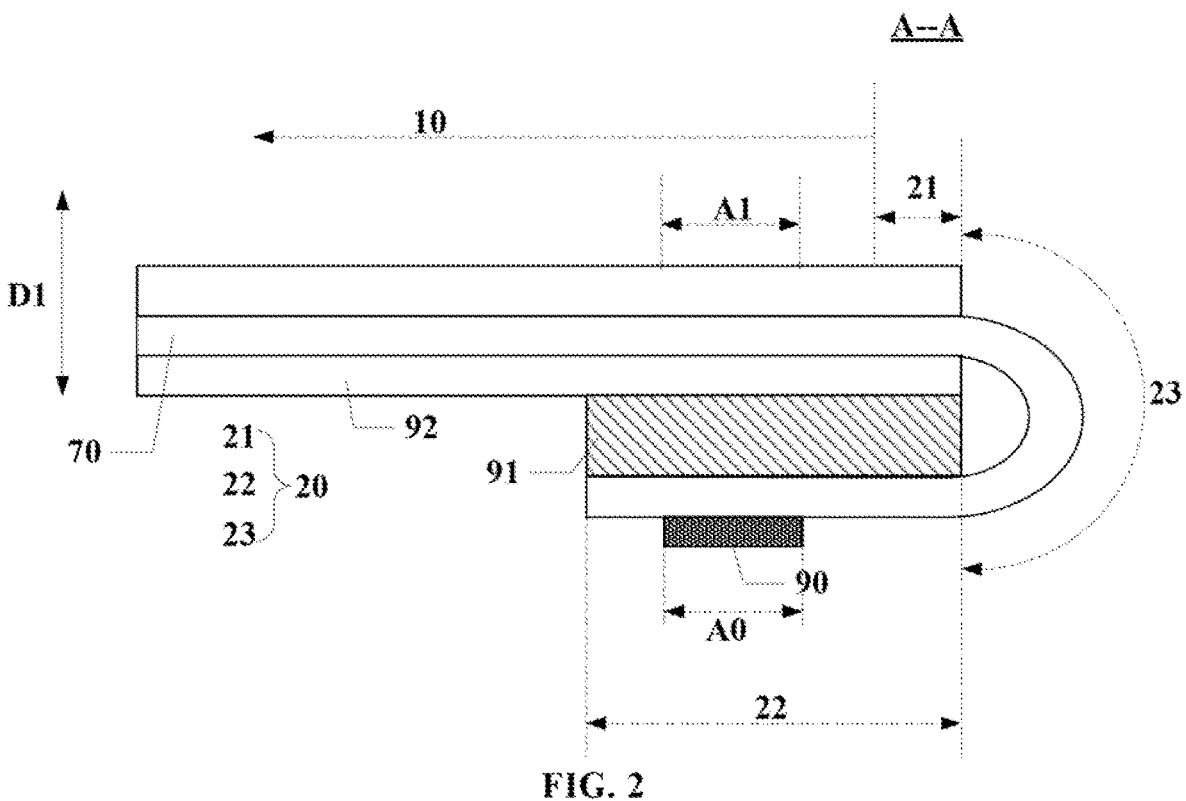
FIG. 2 illustrates a cross-sectional view along an A-A' direction in FIG. 1.
Figure 3:
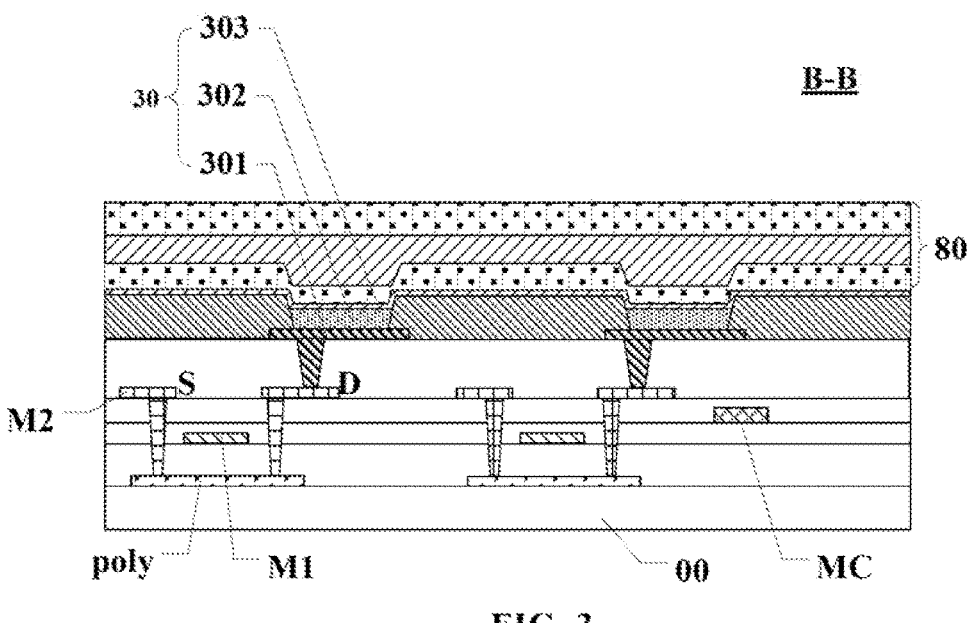
FIG. 3 illustrates a cross-sectional view along a B-B' direction in FIG. 1.
Figure 4:
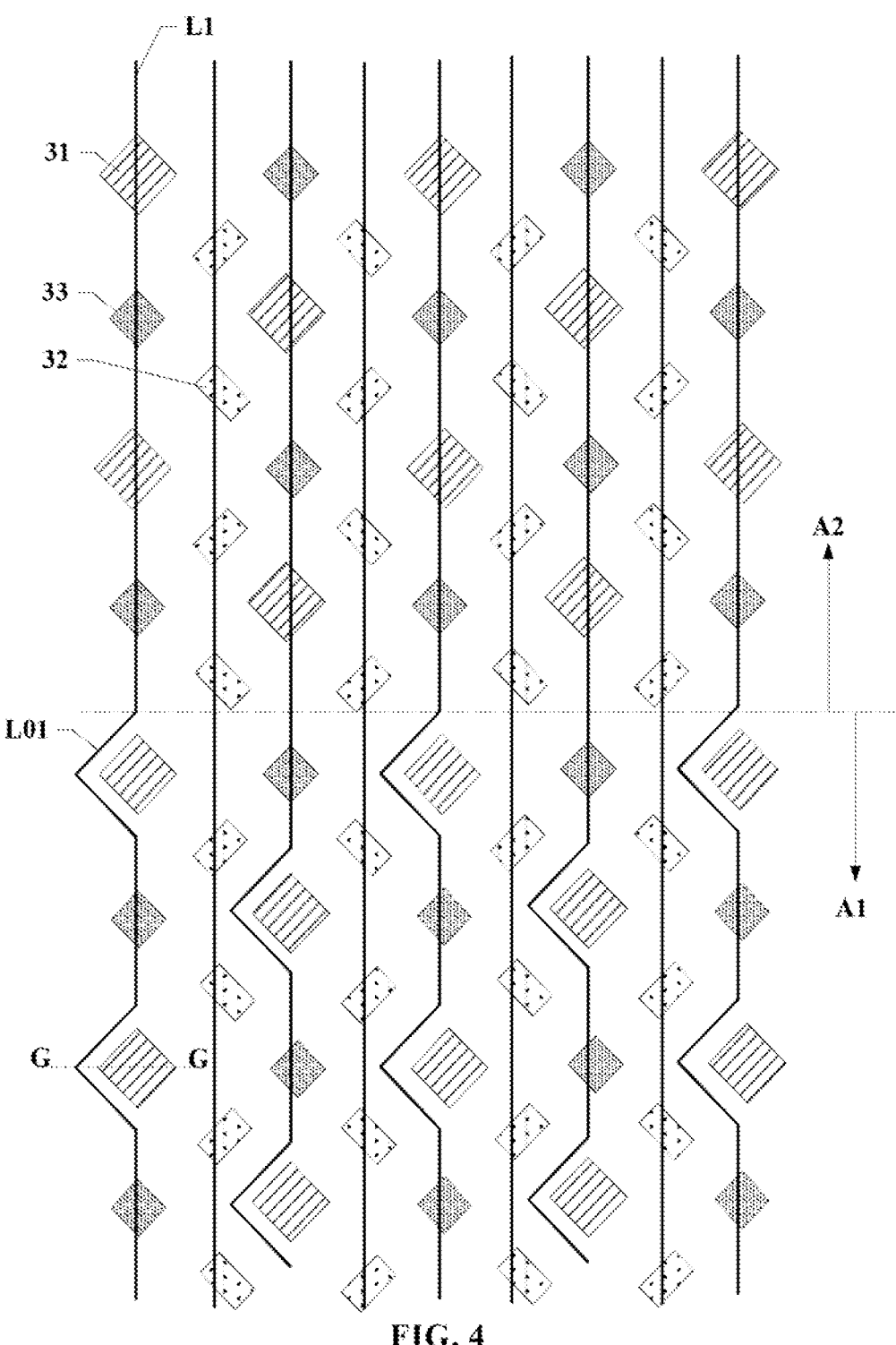
FIG. 4 illustrates an arrangement schematic of light-emitting elements and first signal lines in a display panel.

FIG. 1 illustrates a top view of a display panel according to various embodiments of the present disclosure; FIG. 2 illustrates a cross-sectional view along an A-A' direction in FIG. 1; FIG. 3 illustrates a cross-sectional view along a B-B' direction in FIG. 1; and FIG. 4 illustrates an arrangement schematic of light-emitting elements and first signal lines in the display panel.

It should be noted that the display panel with a rectangular structure may be used as an example for illustration in FIG. 1, which may not limit the shape of the display panel. In some other embodiments of the present disclosure, the shape of the display panel may also be embodied in other shapes, such as a rounded rectangle, a circle or other suitable shapes. FIG. 1 may only schematically illustrate the light-emitting elements included in the display panel, and may not limit the number, arrangement, shape and size of the light-emitting elements actually included in the display panel. FIG. 2 may only schematically illustrate the relative positional relationship of the first region, the bending region and the second region in the display panel and may not limit actual film layer structure of the first region, the bending region and the second region.

Referring to FIGS. 1-4, the present disclosure may provide a display panel 100, including a display region 10 and a non-display region 20; the non-display region 20 may include a first region 21, a bending region 23 and a second region 22 which are on a same side of the display region 10, where the bending region 23 may be between the first region 21 and the second region 22, and the second region 22 may include a binding region A0; and the display region 10 may include a first display region A1, where along the first direction D1, the binding region A0 may be at least partially overlapped with the first display region A1, and the first direction D1 may be the thickness direction of the display panel.

The display panel may further include a plurality of sub-pixels, where the sub-pixels may include pixel circuits and light-emitting elements 30 which are electrically connected to each other; the display panel may further include a first signal line L1 electrically connected to the pixel circuit; the light-emitting element 30 may include an anode 301, a light-emitting layer 302, and a cathode 303 which are arranged along the first direction; the light-emitting elements 30 may include a first-color light-emitting element 31; and at least in the first display region A1, the orthographic projection of the first signal line L1 on the plane of the display panel may be at the periphery of the orthographic projection of the anode 301 of the first-color light-emitting element 31 on the plane of the display panel.

Optionally, the display panel provided in one embodiment may be a display panel using organic light-emitting diode (OLED) display technology, that is, an OLED display panel. The basic structure of the light-emitting functional layer of the OLED display panel may include the anode 301, the light-emitting layer 302 and the cathode 303. When the power supplies an appropriate voltage, the holes in the anode 301 and the electrons in the cathode 303 may combine in the light-emitting material layer to generate bright light. Optionally, an encapsulation layer 80 may be further provided on the side of the cathode 303 away from the anode 301. Compared with thin film field effect transistor liquid crystal displays, OLED display apparatuses have the characteristics of high visibility and brightness, less power consumption, light weight, and thin thickness. Obviously, in some other embodiments of the present disclosure, the display panel may also be a display panel using an inorganic light-emitting diode display technology, such as a Micro LED display panel, a Mini LED display panel, and/or the like. The OLED display panel may be used an example for illustration in FIG. 3.

Referring to FIGS. 1-2, in the display panel provided by embodiments of the present disclosure, the second region 22 in the non-display region 20 may be bent to the non-light-exiting surface of the display region 10 through the bending region 23, such that the binding region A0 on the second region 22 may be at least partially overlapped with the first display region A1 on the display region 10. Optionally, the binding region A0 may be bound with a drive chip 90. The sub-pixel in the display panel may include the pixel circuit and the light-emitting element 30 which are electrically connected to each other. The first signal line L1 may be electrically connected to the pixel circuit for providing signals to the pixel circuit. It should be noted that the pixel circuit connected to the light-emitting element 30 may refer to the pixel circuit in the existing technology, which may not be limited in the present disclosure. In following embodiments, a feasible pixel circuit may be taken as an example for illustration.

Due to the characteristics of the light-emitting material itself, different materials may have different temperature tolerances, and corresponding cleaving temperatures may also be different. When the ambient temperature is higher than the cleaving temperature of the material itself, the light-emitting material may be cleaved and cannot perform normal display function. When the light-emitting elements of different colors in the display panel are made of different light-emitting materials, corresponding cleaving temperatures of the light-emitting elements of different colors may also be different. When the display panel in embodiments of the present disclosure includes multiple light-emitting elements with different light-emitting colors, the light-emitting material of the first-color light-emitting element may be regarded as the light-emitting material with the lowest cleaving temperature. That is, if the display panel includes three color light-emitting elements, the first-color light-emitting element may be most susceptible to the impact of high temperature.

Figure 5:
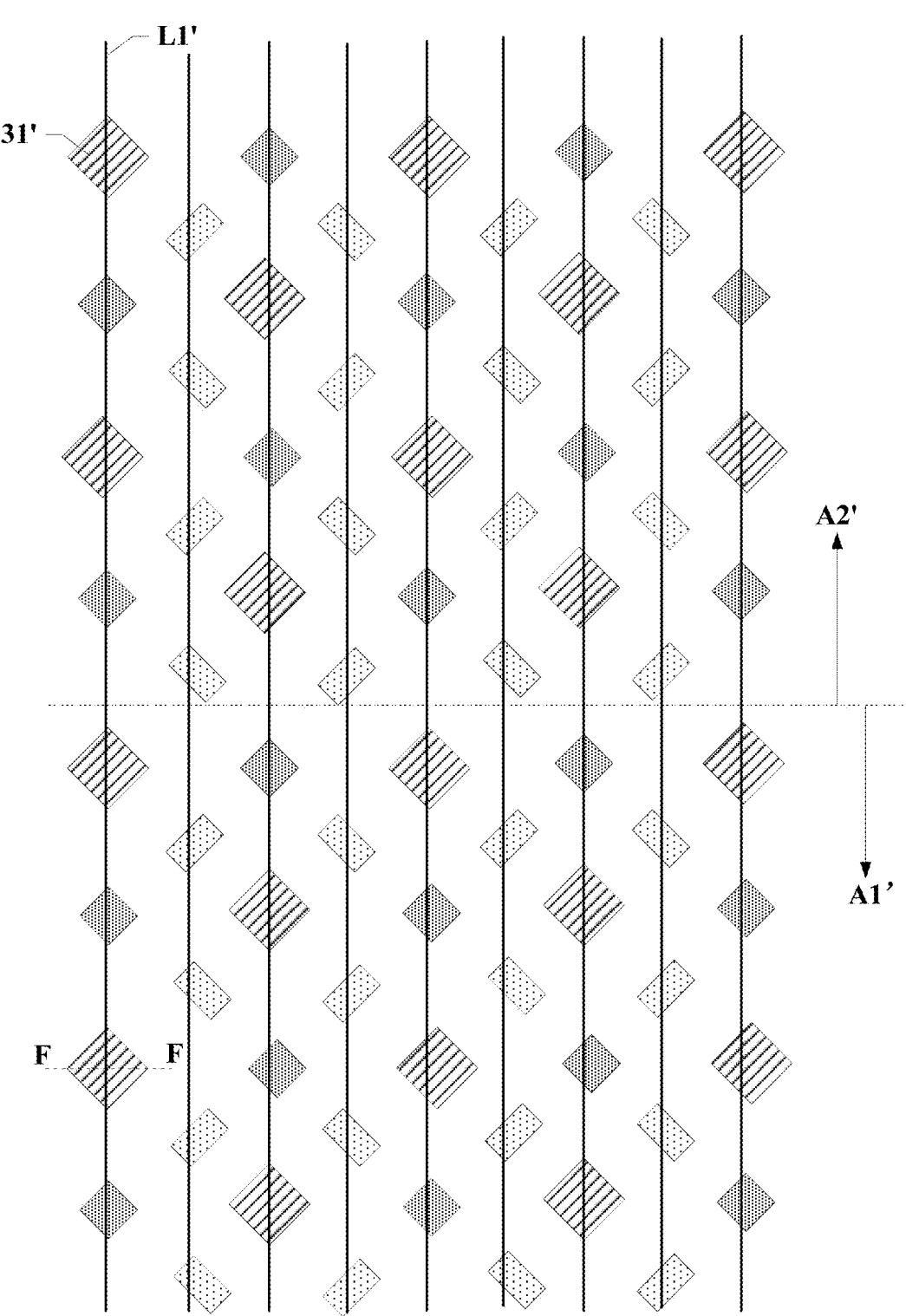
FIG. 5 illustrates an arrangement schematic of light-emitting elements and first signal lines in an existing technology.
Figure 6:
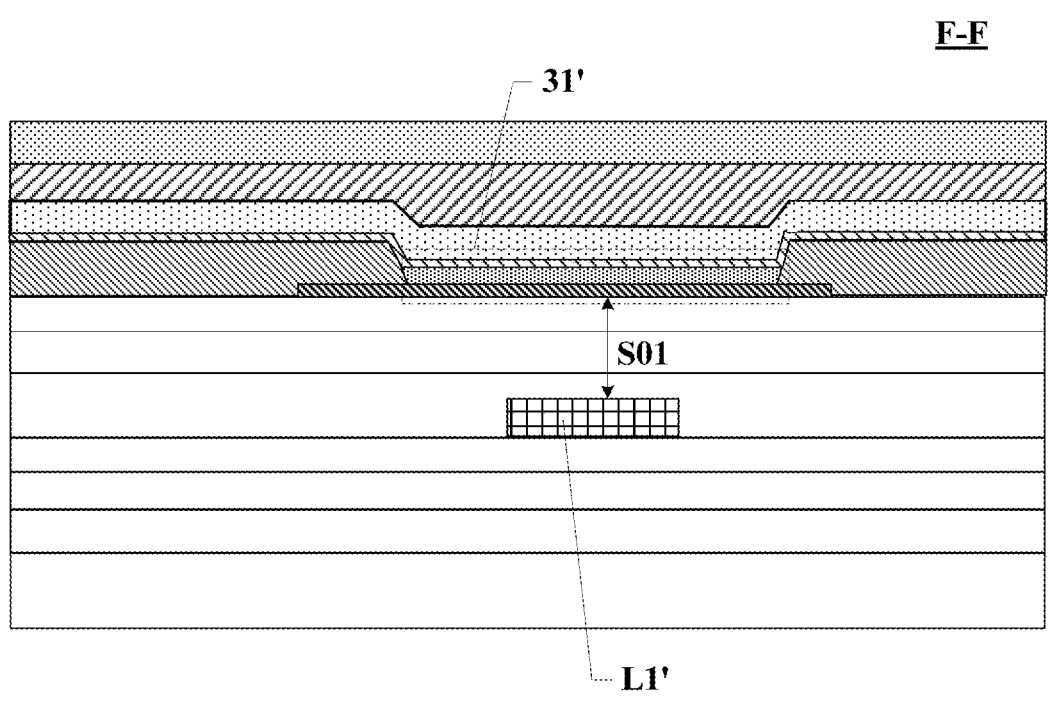
FIG. 6 illustrates a cross-sectional view along an F-F' direction in FIG. 5.
Figure 7:
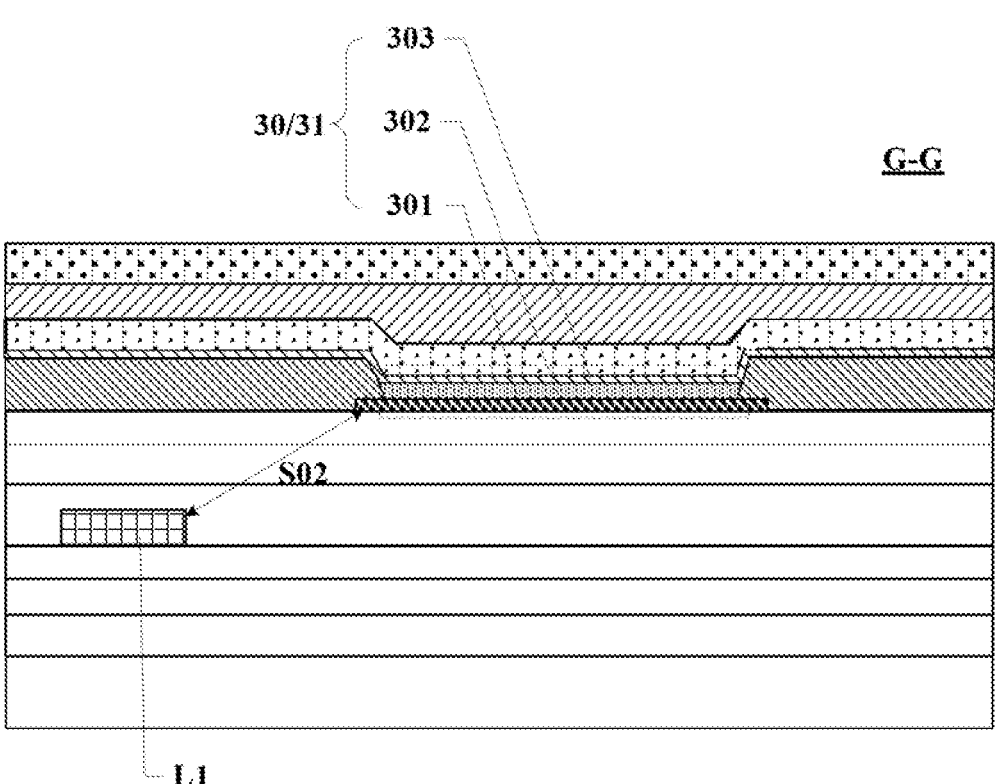
FIG. 7 illustrates a cross-sectional view along a G-G' direction in FIG. 4.

Referring to FIGS. 1-4, in embodiments of the present disclosure, the light-emitting element 30 may include the first-color light-emitting element 31; and at least in the first display region A1, the orthographic projection of the first signal line L1 on the plane of the display panel may be at the periphery of the orthographic projection of the anode 301 of the first-color light-emitting element 31 on the plane of the display panel. That is, the orthographic projection of the first signal line L1 on the plane of the display panel may not be overlapped with the orthographic projection of the first-color light-emitting element 31 on the plane of the display panel; and the first signal line L1 may bypass the position where the first-color light-emitting element 31 is located. In the existing technology, when the first signal line L1' does not bypass the first-color light-emitting element 31', referring to FIGS. 5-6, in the first display region A1', the orthographic projection of the first-color light-emitting element 31' on the plane of the display panel may be overlapped with the orthographic projection of the first signal line L1' on the plane of the display panel. When the heat generated by the first-color light-emitting element 31' is superimposed on the heat generated by the drive chip to act on the first-color light-emitting element 31', the light-emitting material in the first-color light-emitting element 31' may be likely to be cleaved. FIG. 5 illustrates an arrangement schematic of light-emitting elements and first signal lines in the existing technology. FIG. 6 illustrates a cross-sectional view along an F-F' direction in FIG. 5. In the present disclosure, referring to FIGS. 4 and 7, FIG. 7 illustrates a cross-sectional view along a G-G' direction in FIG. 4. In the first display region A1, the first signal line L1 may be arranged on the periphery of the first-color light-emitting element 31, which is equivalent to increasing the heat transmission path compared with the solution of arranging the first signal line L1 directly under the anode of the first-color light-emitting element 31. For example, when the first signal line L1 is arranged directly below the anode of the first-color light-emitting element 31, for example, as shown in FIG. 6, the distance between the anode and the first signal line L1 may be a vertical distance S01. If the first signal line L1 is arranged on the periphery of the orthographic projection of the first-color light-emitting element 31 on the light-exiting surface of the display panel, the distance between the first signal line L1 and the anode may be an oblique distance S02, for example, as shown in FIG. 7. The oblique distance S02 may be greater than above-mentioned vertical distance S01. In such way, even if the first signal line L1 generates a large amount of heat, the heat may attenuate during transmission; and when the heat is transferred from the first signal line L1 to the position of the anode 301, heat attenuation may also become larger due to longer path. Therefore, above-mentioned larger heat may not directly act on the first-color light-emitting element 31. Compared with the existing technology, the heat applied to the first-color light-emitting element 31 may be reduced. Even if the heat generated by the drive chip may act on the first-color light-emitting element 31, the heat generated by the drive chip which is superimposed on the heat generated by the first signal line L1 to act on the first-color light-emitting element 31 may also be reduced. Therefore, it is beneficial to reduce the possibility of cleaving of the light-emitting material of the first-color light-emitting element 31 and avoid the impact on the display effect and service life of the display panel after the light-emitting material is cleaved.

Figure 8:
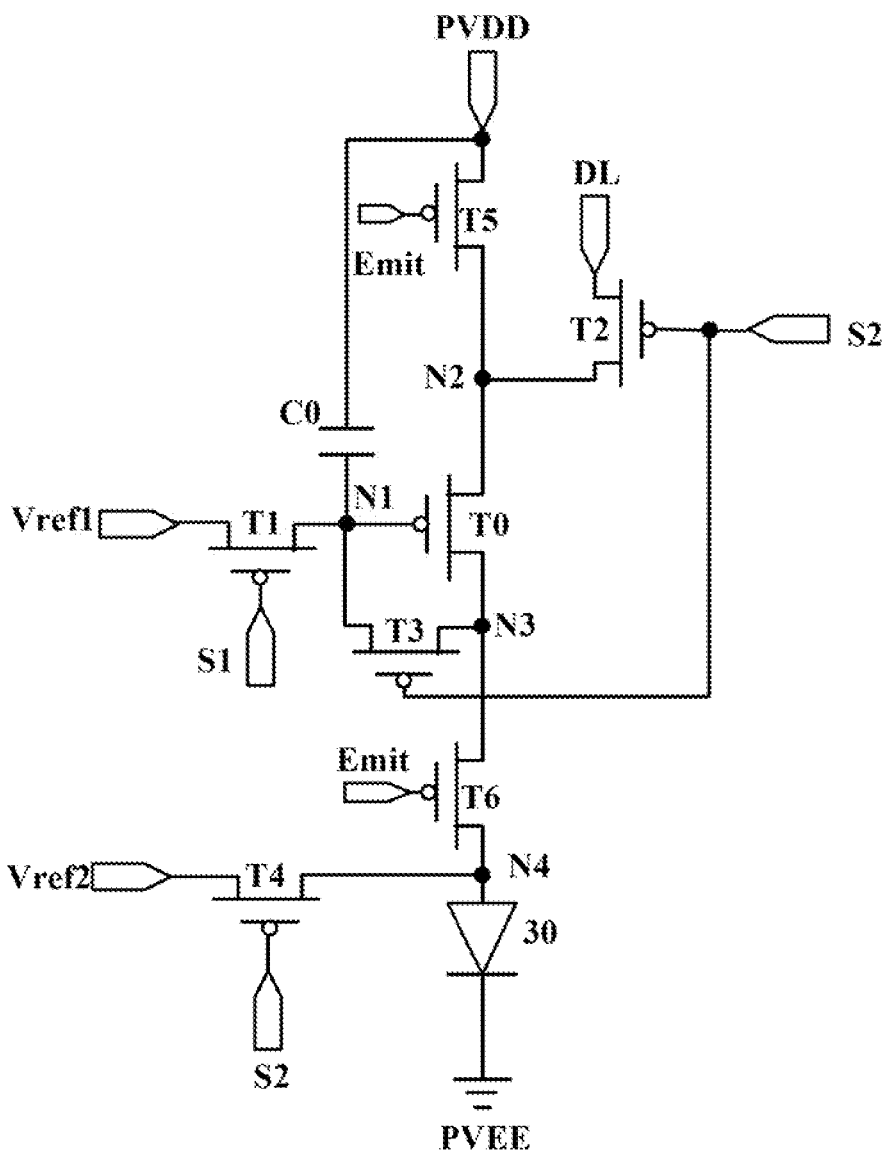
FIG. 8 illustrates a structural schematic of a pixel circuit according to various embodiments of the present disclosure.
Figure 9:
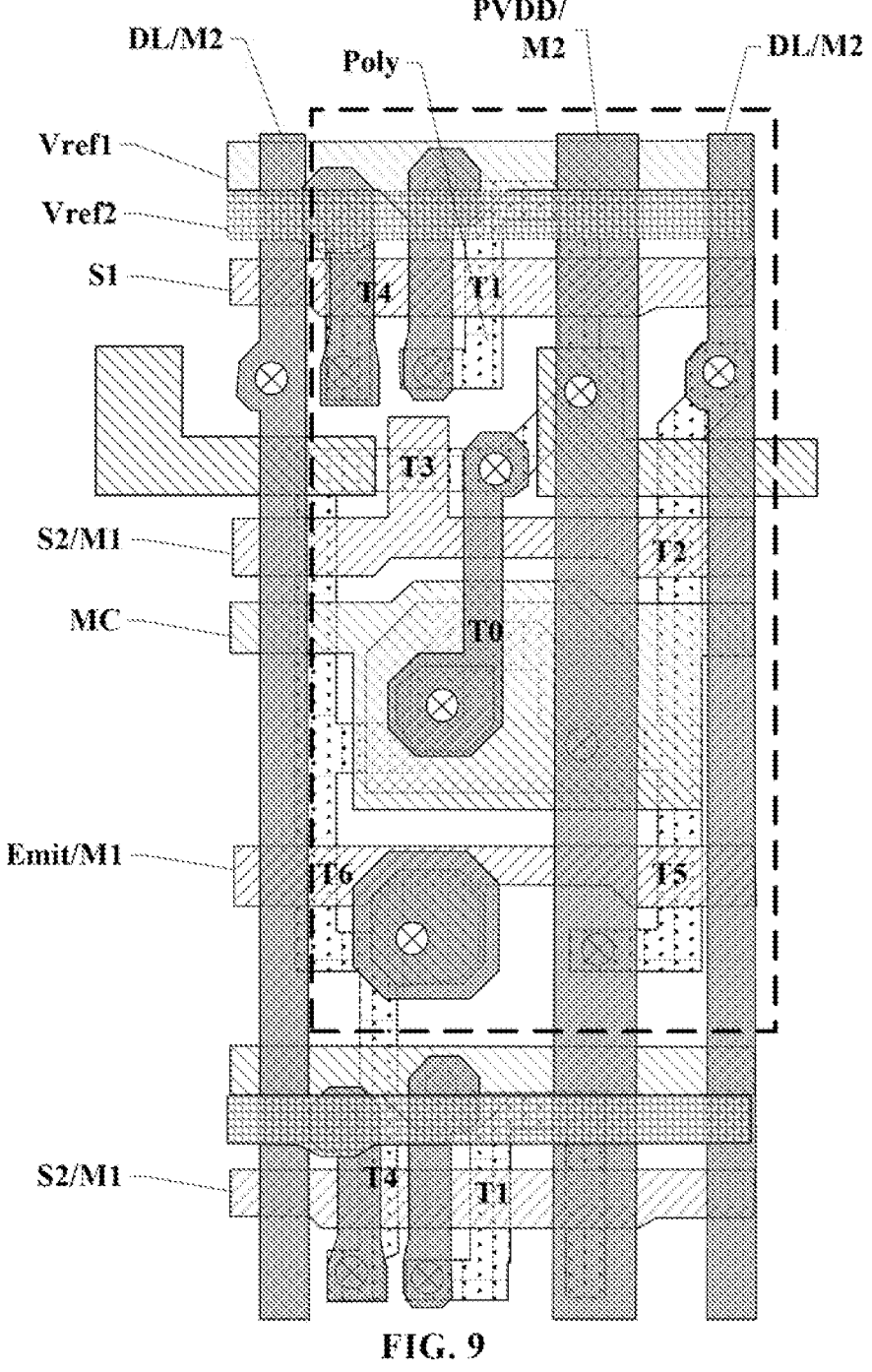
FIG. 9 illustrates a layout schematic corresponding to FIG. 8.

FIG. 8 illustrates a structural schematic of the pixel circuit according to various embodiments of the present disclosure. FIG. 9 illustrates a layout schematic corresponding to FIG.

Figure 10:
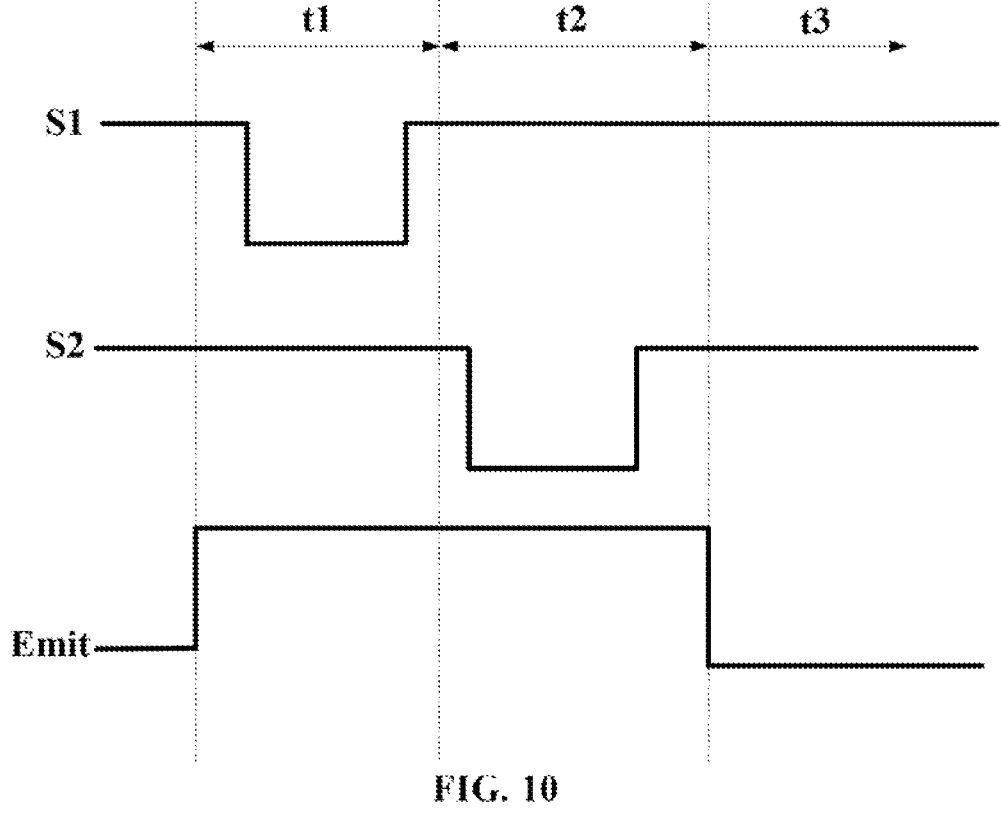
FIG. 10 illustrates a drive time sequence diagram of a pixel circuit in FIG. 8.
Figure 11:
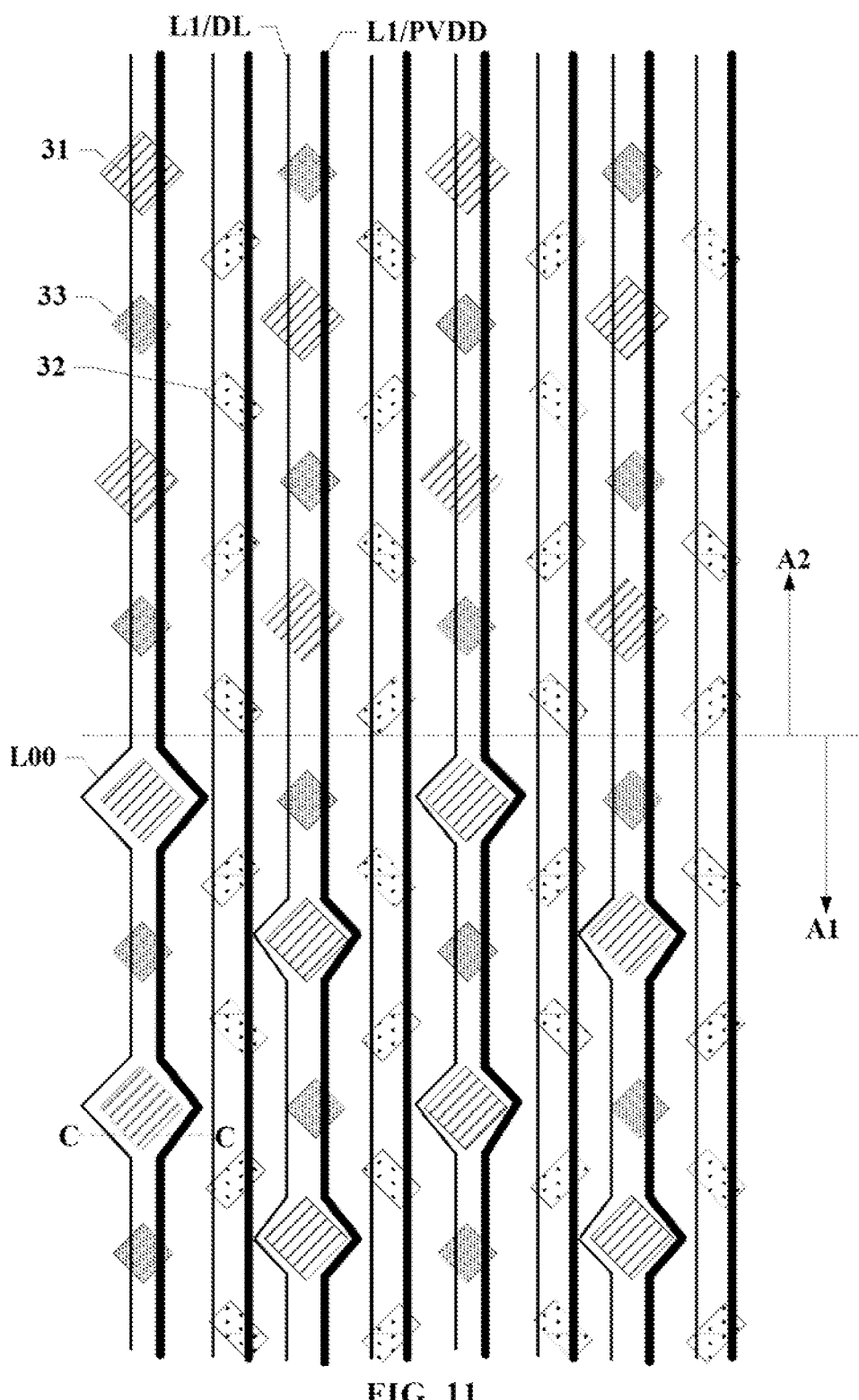
FIG. 11 illustrates an arrangement schematic of light-emitting elements, data lines and first power signal lines.

8. One embodiment illustrates a connection relationship between pixel circuits, data lines DL and first power signal lines PVDD. FIG. 10 illustrates a drive time sequence diagram of the pixel circuit in FIG. 8; and FIG. 11 illustrates an arrangement schematic of light-emitting elements, data lines DL and first power signal lines PVDD. It should be noted that, in order to clearly distinguish the data line DL from the first power signal line PVDD, the data line DL and the first power signal line PVDD are illustrated with different linewidths in FIG. 11, which may not limit actual linewidths of the data line DL and the first power signal line PVDD. In actual products, such two linewidths may be same or different, which may not be limited in the present disclosure.

Referring to FIGS. 8, 9 and 11, in an optional implementation manner of the present disclosure, the display panel may include the data line DL and the first power signal line PVDD; and the first signal line L1 may include at least one of the data line DL and the first power signal line PVDD.

It may be understood that the display panel may be provided with a plurality of data lines DL and a plurality of first power signal lines PVDD; and the pixel circuit for drive the light-emitting element 30 to emit light may be electrically connected to the data line DL and the first power signal line PVDD, which may be configured to obtain a data signal and a first power signal and finally generate a drive current or a drive voltage for drive the light-emitting element 30 to emit light.

In embodiments shown in FIGS. 8 and 9, the pixel circuit may be a 7T1C (7 transistors and 1 capacitor) structure, which may be taken as an example for illustration and may not limit the structure of the pixel circuit in the present disclosure. In some other embodiments of the present disclosure, the pixel circuit may also be embodied in other structures such as 8T1C. Taking the pixel circuit shown in FIG. 8 as an example, the pixel circuit may include a drive transistor T0, a first transistor T1 to a sixth transistor T6, and a storage capacitor CO. Optionally, for the drive transistor T0, the gate electrode may be connected to the first node N1, the first electrode may be connected to the second node N2, and the second electrode may be connected to the third node N3. The light-emitting element 30 may be connected in series between the fourth node N4 and the second power terminal PVEE. The first transistor T1 may be connected in series between the first reset terminal Vref1 and the first node N1; and the second transistor T2 may be connected in series between the data signal line DL and the second node N2. The third transistor T3 may be connected in series between the first node N1 and the third node N3; and the fourth transistor T4 may be connected in series between the second reset terminal Vref2 and the fourth node N4. The fifth transistor T5 may be connected in series between the first power terminal PVDD and the second node N2; and the sixth transistor T6 may be connected in series between the third node N3 and the fourth node N4. The storage capacitor CO may be connected in series between the first power terminal PVDD and the first node N1.

Optionally, referring to FIGS. 8 and 10, the working stage of the pixel circuit may include a first reset stage t1, a data write stage t2 and a light-emitting stage t3. At the first reset stage t1, the first transistor T1 may be in conduction in response to the conduction level of the first control terminal S1 and transmit a reset signal of the first reset terminal VreD1 to the first node N1. At the data write stage t2, the second transistor T2 may be in conduction in response to the conduction level of the second control terminal S2, the third transistor T3 may be in conduction in response to the conduction level of the second control terminal S2, the data signal on the data signal line DL may be transmitted to the second node N2, the signal of the second node N2 may be transmitted to the third node N3 through the drive transistor T0, and the signal of the third node N3 may be transmitted to the first node N1; and the fourth transistor T4 may be in conduction in response to the conduction level of the second control terminal S2, and transmit the reset signal of the second reset terminal Vref2 to the fourth node N4 to reset the anode of the light-emitting element 30. At the light-emitting stage t3, the fifth transistor T5 and the sixth transistor T6 may be in conduction in response to the signal of the light-emitting control signal terminal Emit, the signal on the first power signal line PVDD may be transmitted to the fifth transistor T5 through the first power terminal, and the first drive transistor T0 may transmit the drive signal to the light-emitting element 30 to drive the light-emitting element 30 to emit light. It should be noted that the first reset stage and the second reset stage may be performed simultaneously or in time-sharing, and the reset voltages of the first reset stage and the second reset stage may be same or different, which may not be limited in embodiments of the present disclosure. When the reset voltages are same, the first reset terminal VreD1 and the second reset terminal Vref2 may be embodied as a same signal terminal. Above-mentioned working process of the pixel drive circuit may be only exemplary and may not limit actual working process of the pixel drive circuit of the present disclosure.

It should be noted that above-mentioned pixel drive circuit and working process may be only exemplary and may not limit actual pixel drive circuit and working process included in the display panel.

Referring to FIGS. 3, 8 and 11, the signal transmitted on the data line DL connected to the pixel circuit and the first power signal line PVDD may be a relatively high current signal; and when the high current signal passes through the first power signal line PVDD and the data line DL, it may cause the first power signal line PVDD and the data line DL to heat up obviously. When the first signal line L1 mentioned in embodiments of the present disclosure includes the data line DL, since the light-emitting material corresponding to the first-color light-emitting element is most easily affected by high temperature, the data line DL may be arranged on the periphery of the anode 301 of the first-color light-emitting element 31 in the first display region A1. In such way, it is beneficial for reducing the influence of the heat generated by the data line DL on the light-emitting material of the light-emitting layer 302 corresponding to the first-color light-emitting element 31, thereby being beneficial for ensuring normal display function of the first-color light-emitting element.

When the first signal line L1 mentioned in embodiments of the present disclosure includes the first power signal line PVDD, in the first display region A1, the first power signal line PVDD may be arranged on the periphery of the anode 301 of the first-color light-emitting element 31, which may be beneficial for reducing the influence of the heat generated by the first power signal line PVDD on the light-emitting material of the light-emitting layer 302 corresponding to the first-color light-emitting element 31.

In the first display region A1, when both the data line DL and the first power signal line PVDD are arranged on the periphery of the anode 301 of the first-color light-emitting element 31, relatively large heat generated by the data line DL and the first power signal line PVDD may not directly act on the light-emitting layer 302 of the first-color light-emitting element 31, thereby being more beneficial for reducing the heat applied to the first-color light-emitting element 31 and preventing the cleaving of the light-emitting layer 302 of the first-color light-emitting element 31 to cause abnormal display of the display panel. It should be noted that the solution that the first signal line L1 includes both the data line DL and the first power signal line PVDD is illustrated in FIG. 11. In some other embodiments of the present disclosure, the first signal line L1 may also only include the data line DL or only include the first power signal line PVDD, which may not be limited in the present disclosure.

Figure 12:
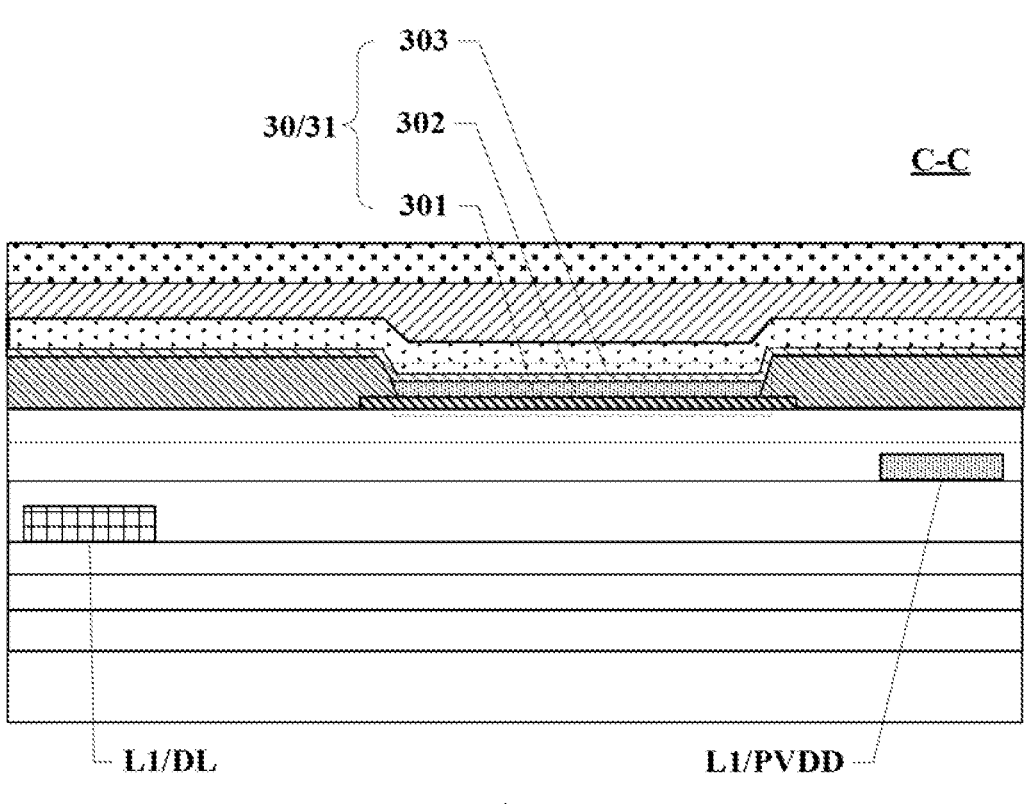
FIG. 12 illustrates a cross-sectional view along a C-C' direction in FIG. 11.

FIG. 12 illustrates a cross-sectional view along a C-C' direction in FIG. 11. It should be noted that the film layer structure of the data line DL and the first power signal line PVDD may be only illustrated in FIG. 12, and other structures in such region may not be illustrated.

Referring to FIG. 12, in an optional implementation manner of the present disclosure, in the first display region A1, the data line DL and the first power signal line PVDD may be arranged in different layers.

Referring to FIGS. 3, 11 and 12, when at least one of the data line DL and the first signal line L1 is wired in the manner of bypassing the anode 301 of the first-color light-emitting element 31, compared with the manner of wiring along a straight line extending in a same direction, the wiring manner of bypassing the anode may occupy a larger space in the display panel. In order to avoid a short circuit between the data line DL and the first power signal line PVDD, in embodiments of the present disclosure, the data line DL and the first power signal line PVDD may be arranged in different film layers. In such way, even when the data line DL and the first power signal line PVDD are wired through bypassing the anode 301 of the first-color light-emitting element in the first display region A1, the data line DL and the first power signal line PVDD may not interfere with each other, which may be beneficial for simplifying the formation difficulty of the data line DL and the first power signal line PVDD. It should be noted that the film layer structure of the data line DL and the first power signal line PVDD on the display panel may be exemplarily illustrated in FIG. 12, which may not limit specific film layer positions of the data line DL and the first power signal line PVDD. The feasible film layer positions of the data line DL and the first power signal line PVDD are described in subsequent embodiments.

Figure 13:
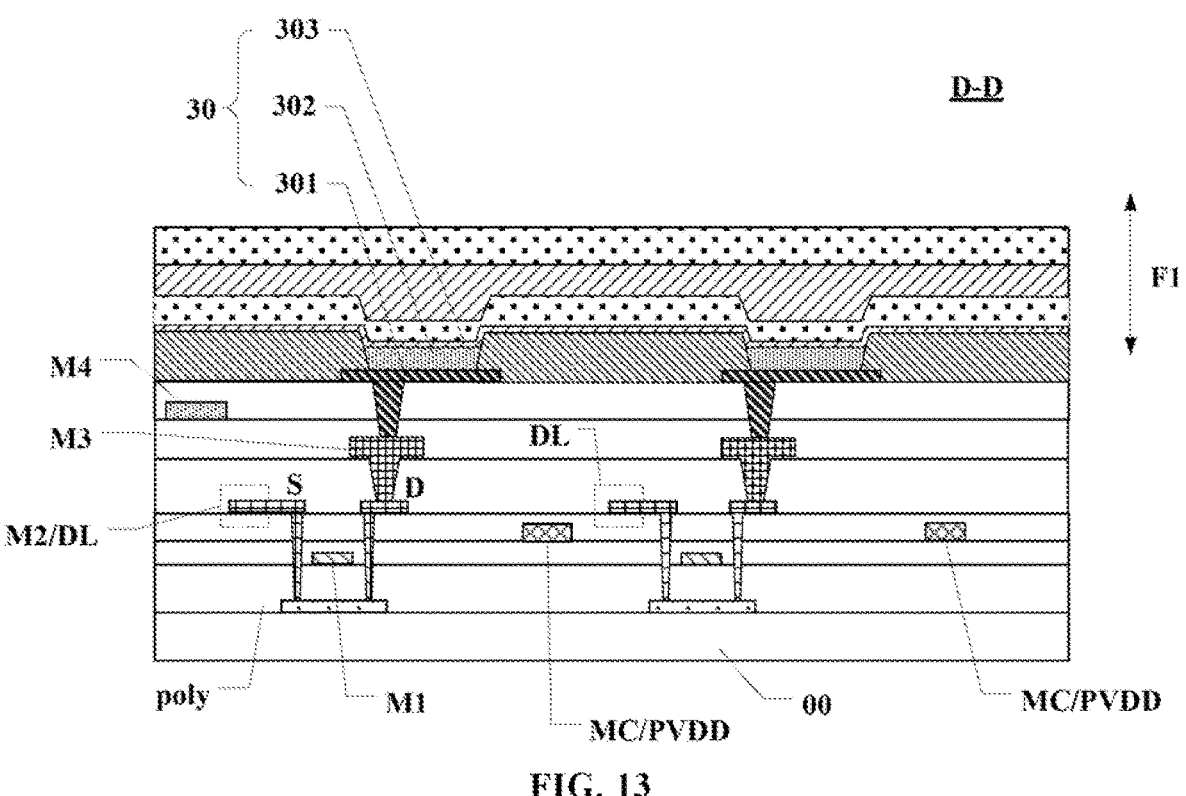
FIG. 13 illustrates a cross-sectional view along a D-D' direction of a display panel in FIG. 1.

FIG. 13 illustrates a cross-sectional view along a D-D' direction of the display panel in FIG. 1. Referring to FIGS. 10-13, in an optional implementation manner of the present disclosure, the display panel may include a substrate 00, and a first metal layer M1, a capacitor metal layer MC, a second metal layer M2, and a third metal layer M3 which are disposed on the side of the substrate 00. Along the first direction D1, the capacitor metal layer MC may be on the side of the first metal layer M1 away from the substrate, and the second metal layer M2 may be on the side of the capacitor metal layer MC away from the substrate. The third metal layer M3 may be between the second metal layer M2 and the light-emitting element 30. The data line DL may be in one layer of the second metal layer M2, the capacitor metal layer MC and the third metal layer M3; and the first power signal line PVDD may be in another layer of the second metal layer M2, the capacitor metal layer MC and the third metal layer M3.

Optionally, the display panel may further include a semiconductor layer poly. The semiconductor layer poly may be on the side of the first metal layer M1 away from the substrate 00 or on the side of the first metal layer M1 facing the substrate 00. The first metal layer M1 may be, for example, a gate metal layer; and the gate electrode of the transistor in the display panel may be disposed on the first metal layer M1. The capacitor metal layer MC may be configured to form a capacitor structure with the first metal layer M1 or the second metal layer M2. The source electrode S and the drain electrode D of the transistor in the display panel may be in the second metal layer M2; the semiconductor layer poly may include a source region and a drain region; and the source region and the drain region may be formed by doping N-type impurity ions or P-type impurity ions. The source electrode S of the transistor may be electrically connected to the source region of the semiconductor layer poly through a contact hole, and the drain electrode D of the transistor may be electrically connected to the drain region of the semiconductor layer poly through a contact hole.

For example, in the display panel provided by one embodiment, four metal layers, which are respectively the first metal layer M1, the capacitor metal layer MC, the second metal layer M2 and the third metal layer M3, may be disposed between the substrate 00 and the light-emitting element 30. When the data line DL and the first power signal line PVDD are arranged in different layers, the data line DL may be arranged in one of above four metal layers, and the first power signal line PVDD may be arranged in remaining three metal layers layer. For example, the data line DL may be arranged in the second metal layer M2 or the third metal layer M3, optionally, in the second metal layer M2; and the first power signal line PVDD may be arranged in the capacitor metal layer MC or the first metal layer M1. One embodiment shown in FIG. 10 illustrates the solution that the data line DL is arranged in the second metal layer M2, and the first power signal line PVDD is arranged in the capacitor metal layer MC. At this point, the vertical distance between the light-emitting element 30 and each of the first power signal line PVDD and the data line DL may be relatively long. Moreover, the first power signal line PVDD may be farther away from the light-emitting element 30 than the data line DL, which may increase the transmission path of the heat generated by the first power signal line PVDD to the light-emitting element 30. Obviously, in order to increase the heat transfer path to the light-emitting element 30 as possible, the first power signal line PVDD and the data line DL may also be respectively arranged in the capacitor metal layer MC and the first metal layer M1 which are relatively far from the light-emitting element 30, which may not be limited in the present disclosure.

Referring to FIG. 11, in an optional implementation manner of the present disclosure, in the first display region A1, the first signal line L1 may include a plurality of sub-line segments L00 connected end-to-end; and at least a part of the sub-line segments L00 may be wired along the contour of the anode 301 of the first-color light-emitting element 31.

For example, in one embodiment, the orthographic projection of the anode of the first-color light-emitting element 31 on the display panel may be a rhombus as an example for illustration. When the first signal line L1 is disposed on the periphery of the orthographic projection of the anode 301 of the first-color light-emitting element 31 on the display panel, the sub-line segment L00 in the first signal line L1 may be wired along the outer edge of the rhombus structure to form a sawtooth-like structure. Such wiring manner may be beneficial for reducing the bypassing length of the first signal line L1 and reducing the length difference between different first signal lines L1. When the first signal line L1 in the first display region A1 is disposed using the bypassing manner, it is equivalent to extending the length of the first signal line L1, such that the length of the first signal line L1 passing through the first display region A1 may be greater than the length of the first signal line L1 not passing through the first display region A1. When the lengths of the first signal lines L1 are different, the magnitudes of the coupling capacitance between the first signal lines L1 and other conductive film layers may also be different. In embodiments of the present disclosure, in the first display region, the manner of wiring the first signal line L1 along the anode of the first-color light-emitting element 31 may be beneficial for reducing the length difference between different first signal lines L1 as possible, thereby further being beneficial for reducing the coupling capacitance difference between different first signal lines L1 and corresponding conductive film layers and improving the uniformity of signals transmitted by different first signal lines L1.

Figure 14:
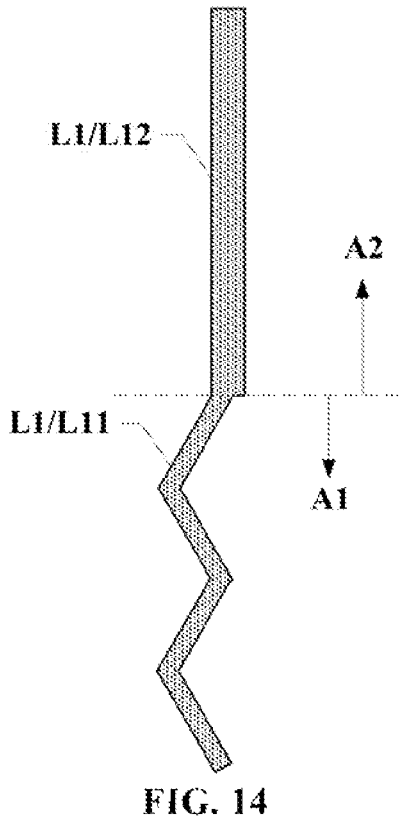
FIG. 14 illustrates a wiring schematic of first signal lines in a first display region and a second display region.

FIG. 14 illustrates a wiring schematic of the first signal lines L1 in a first display region A1 and a second display region A2. Referring to FIGS. 1 and 14, the relative positional relationship between the first display region A1 and the second display region A2 in the display panel may be illustrated in one embodiment. Optionally, the second display region A2 may be regarded as a region in the display region except the first display region A1.

Referring to FIGS. 1 and 14, in an optional implementation manner of the present disclosure, the display panel may further include the second display region A2 disposed on the periphery of the first display region A1; the first signal line L1 may include a first line segment L11 in the first display region A1 and a second line segment L12 in the second display region A2; and the linewidth of the first line segment L11 may be less than the linewidth of the second line segment L12.

For example, when the first signal line L1 does not pass through the first display region A1, that is, when the orthographic projection of the first signal on the display panel is not overlapped with the first display region A1, such part of the first signal line L1 is wired along the straight line; and when the first signal line L1 passes through the first display region A1, that is, when the orthographic projection of the first signal line L1 on the display panel is overlapped with the first display region A1, such part of the first signal line L1 in the first display region A1 is wired in the bypassing manner. Therefore, the length of the first signal line L1 passing through the first display region A1 may be greater than the length of the first signal line L1 not passing through the first display region A1. When different first signal lines L1 all use equal linewidth configuration manner, the coupling capacitance formed between the first signal line L1 passing through the first display region A1 and other conductive film layers may be greater than the coupling capacitance between the first signal line L1 not passing through the first display region A1 and other film layers. Therefore, in embodiments of the present disclosure, the linewidth of the first signal line L1 passing through the first display region A1 may be designed in a differentiated manner. For example, the linewidth of the first line segment L11 in the first display region A1 in the first signal line L1 may be configured to be less than the linewidth of the second line segment L12 in the second display region A2. In such way, the coupling capacitance, which is formed between the first line segment L11 and other conductive film layers, may be reduced. Therefore, overall coupling capacitance formed between the first signal line L1 passing through the first display region A1 and other conductive film layers may be reduced, and the differences in coupling capacitance between different first signal lines L1 and other conductive film layers may be reduced, thereby being beneficial for improving the uniformity of signals transmitted by different first signal lines L1.

Figure 15:
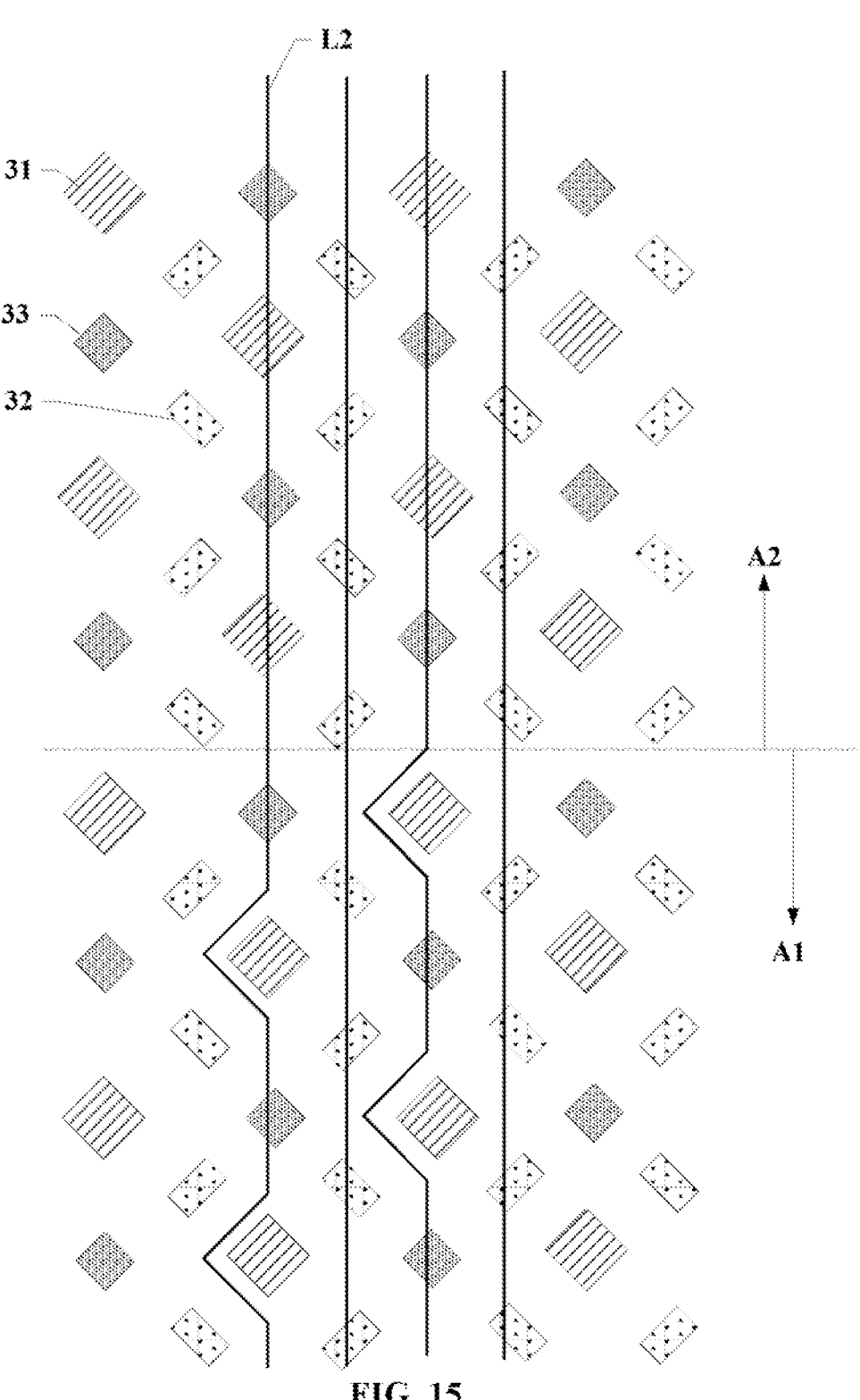
FIG. 15 illustrates a schematic of a relative position relationship between second signal lines and light-emitting elements.

FIG. 15 illustrates a schematic of a relative position relationship between the second signal lines L2 and the light-emitting elements.

Referring to FIGS. 13 and 15, in an optional embodiment of the present disclosure, the display panel may include the substrate 00, and the first metal layer M1, the capacitor metal layer MC, the second metal layer M2, the third metal layer M3 and the fourth metal layer M4 which are disposed on the side of the substrate 00. Along the first direction D1, the capacitor metal layer MC may be on the side of the first metal layer M1 away from the substrate, the second metal layer M2 may be on the side of the capacitor metal layer MC away from the substrate, the third metal layer M3 may be between the second metal layer M2 and the fourth metal layer M4, and the fourth metal layer M4 may be on the side of the light emitting element 30 facing the substrate. The display panel may further include a plurality of second signal lines L2 in the fourth metal layer M4; and at least a part of the second signal lines L2 may be in the first display region A1. In the first display region A1, the orthographic projection of the second signal line L2 on the plane of the display panel may be at the periphery of the orthographic projection of the anode 301 of the first-color light-emitting element 31 on the plane of the display panel.

For example, referring to FIGS. 13 and 15, the fourth metal layer M4 where the second signal line L2 is located may be the metal layer closest to the light-emitting element 30 among the first metal layer M1, the capacitor metal layer MC, the second metal layer M2, the third metal layer M3 and the fourth metal layer M4. The heat dissipated from the second signal line L2 may have a great influence on the light-emitting element 30. Therefore, in embodiments of the present disclosure, a part of the second signal line L2 in the first display region A1 may be arranged on the periphery of the orthographic projection of the anode 301 of the first-color light-emitting element 31 on the plane of the display panel, such that the path for the heat generated on the second signal line L2 to be transmitted to the anode 301 of the first-color light-emitting element 31 may be increased. In such way, it is beneficial for reducing the influence of the heat generated on the second signal line L2 on the light-emitting layer 302 of a second-color light-emitting element 32 and reducing the heat received by the first-color light-emitting element 31 as a whole, thereby being beneficial for avoiding cleaving of the light-emitting layer 302 of the first-color light-emitting element 31 due to high temperature, and further beneficial for avoiding the problem of abnormal display of the display panel.

Figure 16:
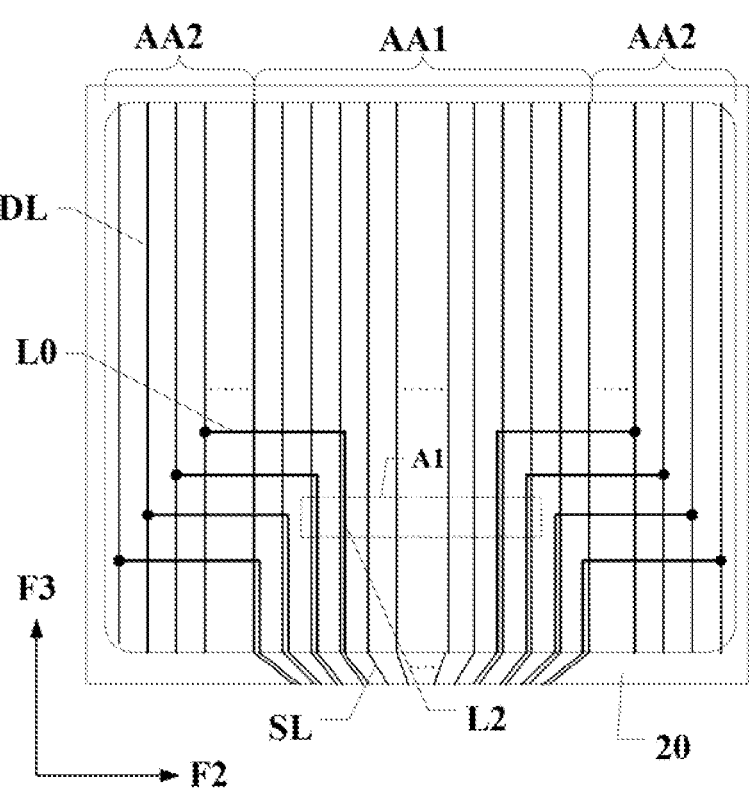
FIG. 16 illustrates a connection schematic of data lines and fan-out wirings in a display panel according to various embodiments of the present disclosure.
Figure 17:
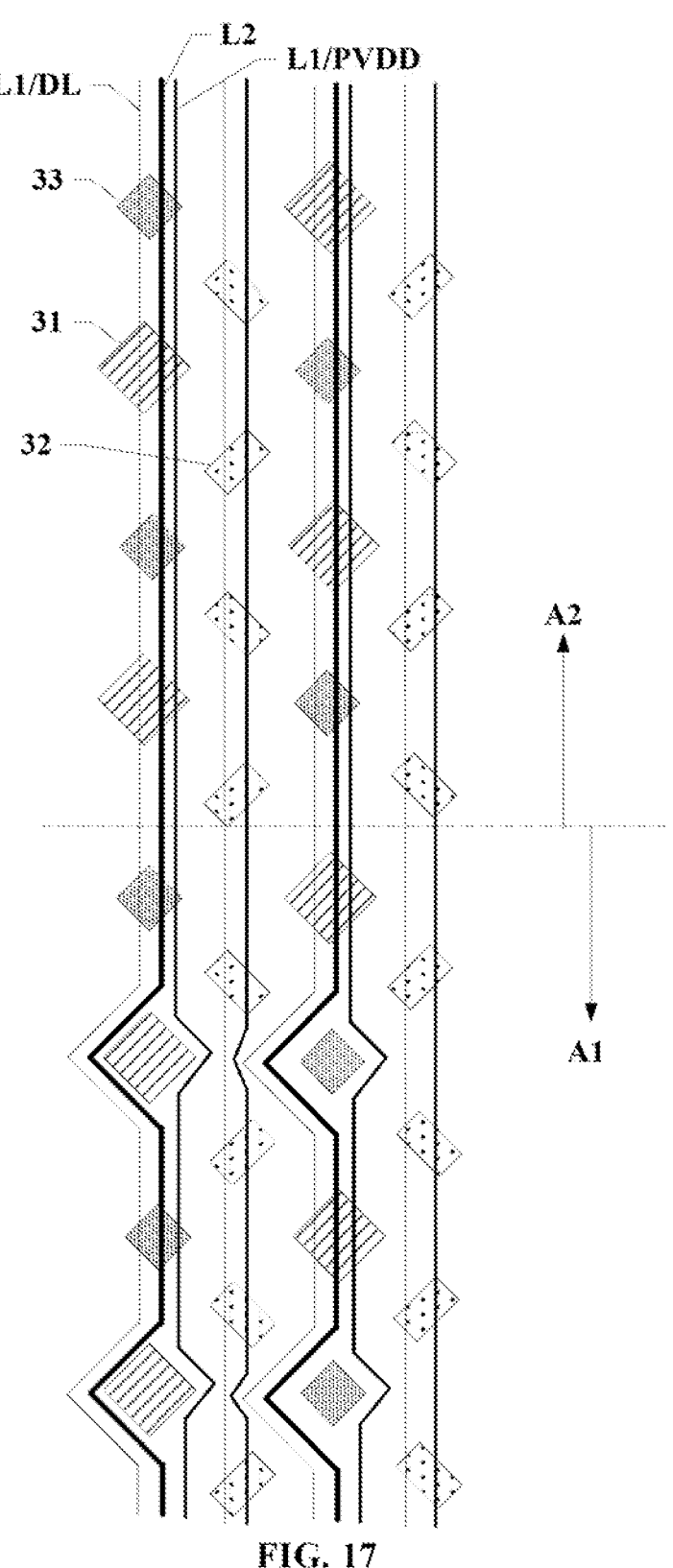
FIG. 17 illustrates an arrangement schematic of data lines, first power signal lines and connection wirings in FIG. 16.

FIG. 16 illustrates a connection schematic of the data lines DL and the fan-out wirings SL in the display panel according to various embodiments of the present disclosure. FIG. 17 illustrates an arrangement schematic of the data lines, the first power signal lines and the connection wirings in FIG. 16.

In an optional implementation manner of the present disclosure, the display region 10 may include a first display region AA1 and a second display region AA2, where the second display region AA2 may be on at least one side of the first display region AA1 along the second direction F2; both the first display region AA1 and the second display region AA2 may include a plurality of data lines DL extending along the third direction F3 and arranged along the second direction F2, where the second direction F2 may intersect the third direction F3; the non-display region 20 may include fan-out wirings SL, where the data lines DL may be electrically connected to the fan-out wirings SL. The data line DL in the second display region AA2 may be electrically connected to the fan-out wiring SL through the connection wiring L0; the second signal line L2 may include the connection wiring L0.

The data lines DL and the fan-out wirings SL included in the display panel may be only exemplarily illustrated in FIG. 16, which not limit the numbers of the data lines DL and the fan-out wirings SL actually included in the display panel. Similarly, the number of data lines DL included in the first display region AA1 and the second display region AA2 shown in FIG. 16 may be only exemplary, which may not indicate actual number of data lines DL included in the first display region AA1 and the second display region AA2.

In the display panel provided by the embodiment of the present disclosure, the second display region AA2 in the display region may be on at least one side of the first display region AA1 along the second direction F2; the fan-out wirings may be arranged in the non-display region 20; the data line DL in the first display region AA1 may directly extend to the position of the fan-out wiring to be electrically connected to the fan-out wiring SL; and the data line DL in the second display region AA2 may be electrically connected to the fan-out wiring SL through the connection line L0 in the display region. In the connection wiring L0 corresponding to the data line DL in the second display region AA2, a partial line segment may be in the second display region AA2 for electrical connection with the data line DL in the second display region AA2, and another partial line segment may be in the first display region AA1 for electrical connection with the fan-out wiring SL; and such two line segments may be electrically connected to each other. In such way, there is no need to arrange fan-out wirings SL near the lower left border and/or lower right border of the display panel, thereby providing a reducible space for the border of the display panel and being beneficial for realizing narrow border design of the display panel. Referring to FIGS. 16 and 17, optionally, the connection wiring L0 may be in the fourth metal layer M4, and the second signal line L2 in the fourth metal layer M4 may include above connection wiring L0. That is, in order to realize the narrow frame design of the display panel, the connection wiring L0 may be introduced on the display panel. When the connecting wiring L0 passes through the first display region A1, the part of the connecting wiring L0 in the first display region A1 may be wiring in a bypassing manner, which may avoid the connecting wiring L0 in the first display region A1 from being overlapped with the anode of the first-color light-emitting element 31. Therefore, the heat transmitted from the connection wiring L0 to the first-color light-emitting element 31 may be reduced, thereby reducing overall heating of the first-color light-emitting element 31 and avoiding cleaving due to excessive high temperature.

Referring to FIG. 4, in an optional embodiment of the present disclosure, the light-emitting element 30 may further include the second-color light-emitting element 32 and a third-color light-emitting element 33. The cleaving temperature of the material of the light-emitting layer 302 in the first-color light-emitting element 31 is T1, the cleaving temperature of the material of the light-emitting layer 302 in the second-color light-emitting element 32 is T2, and the cleaving temperature of the material of the light-emitting layer 302 in the third-color light-emitting element 33 is T3, where T1<T2, and T1<T3.

For example, since the light-emitting material of the first-color light-emitting element 31 has the lowest cleaving temperature, it is more sensitive to high temperature. That is, under a same higher temperature environment, the light-emitting material of the first-color light-emitting element 31 may be most likely to be cleaved. Therefore, in embodiments of the present disclosure, when the first signal line L1 is arranged in the first display region A1, the first signal line L1 may be avoided from passing through the region where the first-color light-emitting element 31 is located and may be arranged on the periphery of the anode 301 of the first-color light-emitting element 31, which may reduce the heat acting on the first-color light-emitting element 31 and avoid the cleaving of the light-emitting layer 302 of the first-color light-emitting element 31.

Optionally, the first-color light-emitting element 31 may be a blue light-emitting element, the second-color light-emitting element 32 may be a green light-emitting element, and the third-color light-emitting element 33 may be a red light-emitting element. It should be noted that the lowest cleaving temperature of the blue light-emitting element may be taken as an example for illustration in one embodiment. In some other embodiments of the present disclosure, due to differences in light-emitting materials, the cleaving temperature of blue light-emitting elements may also be higher than that of light-emitting elements of other colors, which may not be limited in the present disclosure herein.

Figure 18:
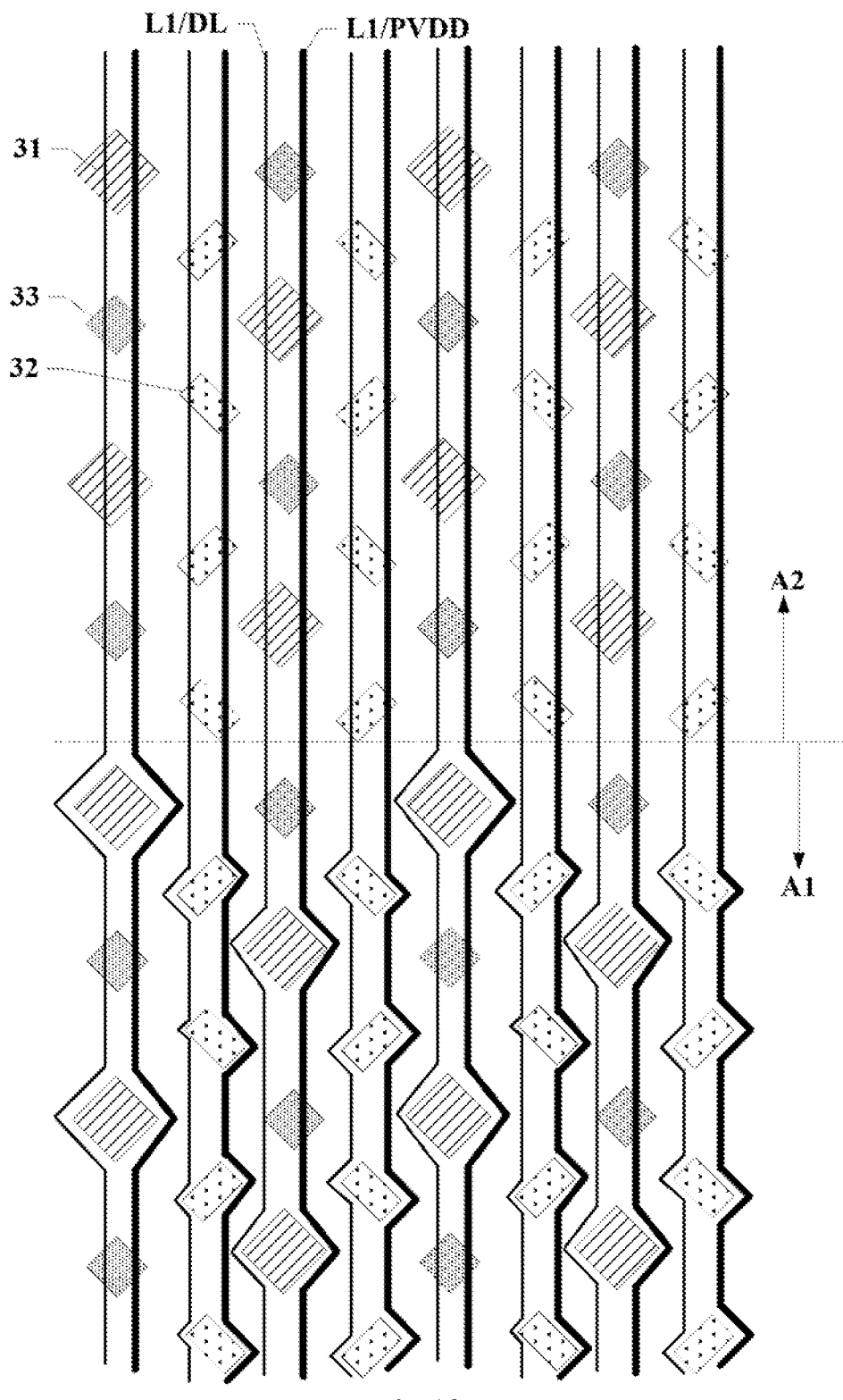
FIG. 18 illustrates another arrangement schematic of light-emitting elements and first signal lines in a display panel.

FIG. 18 illustrates another arrangement schematic of the light-emitting elements and the first signal lines in the display panel. In one embodiment, it describes another bypassing manner of the first signal line L1 when the first-color light-emitting element 31, the second-color light-emitting element 32 and the third-color light-emitting element 33 are all arranged in the first display region A1.

Referring to FIG. 18, in an optional implementation manner of the present disclosure, T2<T3; and in the first display region A1, the orthographic projection of the first signal line L1 on the plane of the display panel may be at the periphery of the orthographic projection of the anode of the second-color light-emitting element 32 on the plane of the display panel.

For example, when the cleaving temperature T2 of the light-emitting layer 302 of the second-color light-emitting element 32 is lower than the cleaving temperature T2 of the light-emitting layer 302 of the third-color light-emitting element 33, the light-emitting layer 302 of the second-color light-emitting element 32 may be easier to be cleaved than the light-emitting layer 302 of the third-color light-emitting element 33. Therefore, when arranging the first signal line L1 in the first display region A1, the first signal line L1 may bypass both the first-color light-emitting element 31 and the second-color light-emitting element 32, thereby being beneficial for reducing the heat applied to the light-emitting layer 302 of the first-color light-emitting element 31 and the second-color light-emitting element 32, and being beneficial for preventing cleaving of the light-emitting layer 302 of the first-color light-emitting element 31 and the second-color light-emitting element 32.

Figure 19:
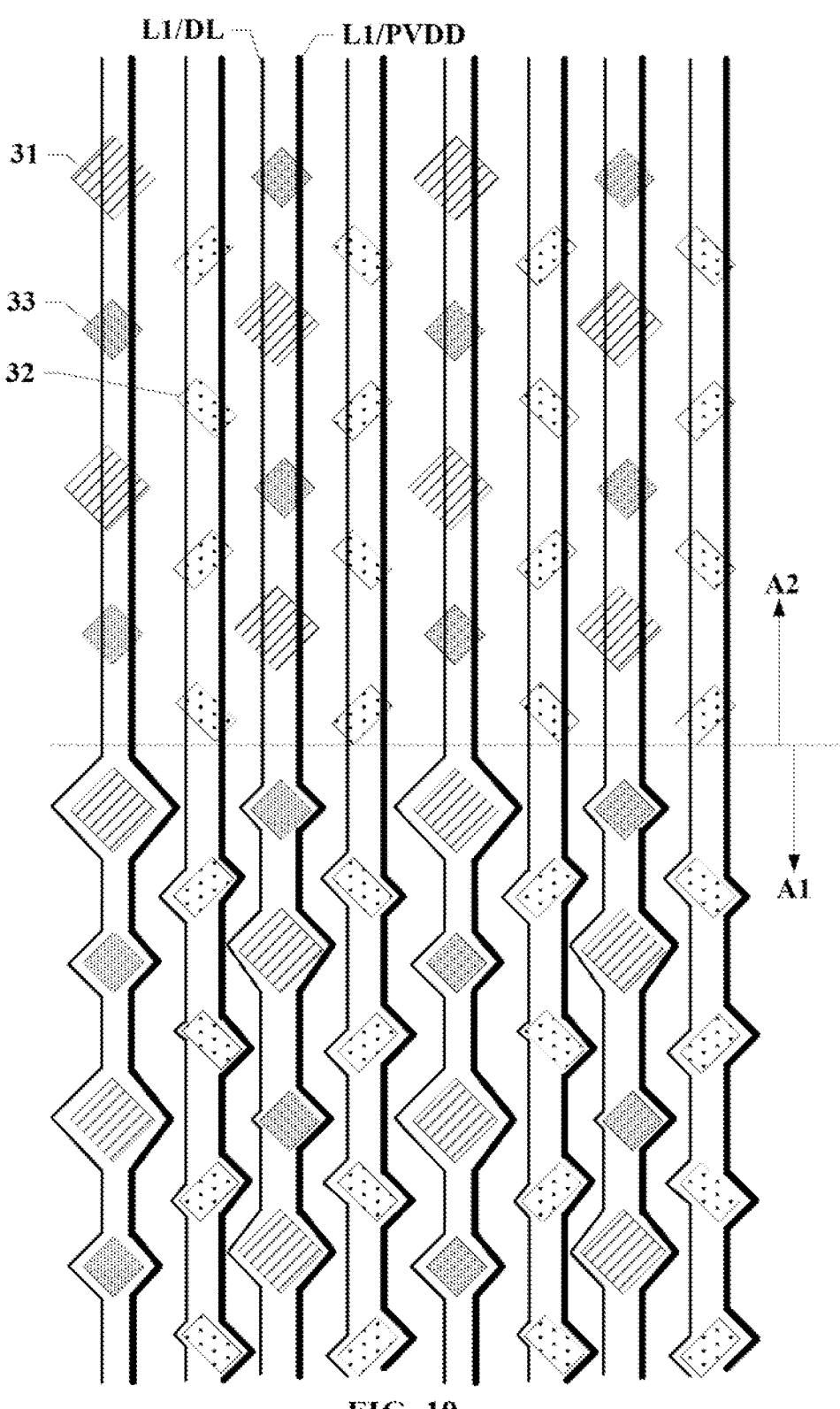
FIG. 19 illustrates another arrangement schematic of light-emitting elements and first signal lines in a display panel.

FIG. 19 illustrates another arrangement schematic of the light-emitting elements and the first signal lines in the display panel. In one embodiment, it describes another bypassing manner of the first signal line L1 when the first-color light-emitting element 31, the second-color light-emitting element 32 and the third-color light-emitting element 33 are all arranged in the first display region A1.

Referring to FIG. 18, in an optional embodiment of the present disclosure, in the first display region A1, along the first direction, the first signal line L1 may be not overlapped with each of the first-color light-emitting element 31, the second-color light-emitting element 32 and the third-color light-emitting element 33.

For example, in one embodiment, it describes an arrangement solution that the first signal lines L1 in the first display region A1 are wired by bypassing each light-emitting element 30. In such way, the first signal line L1 may be not directly disposed under each light-emitting element 30 in the first display region A1, and the heat emitted by each first signal line L1 may not directly act on each light-emitting element 30, which may reduce the heat received by each light-emitting element 30 in the first display region A1, thereby reducing the cleaving of the light-emitting layer 302 of the light-emitting element 30 due to heating.

It should be noted that the arrangement of pixels shown in the drawings of embodiments of the present disclosure may be only exemplary and may not limit the shapes, sizes and arrangement manner of the light-emitting elements 30.

Figure 20:
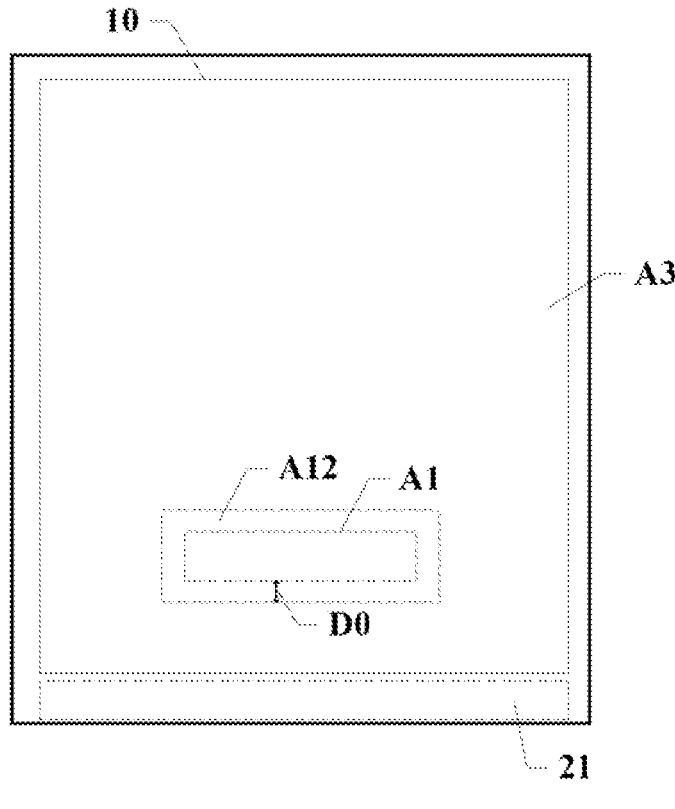
FIG. 20 illustrates another top view of a display panel according to various embodiments of the present disclosure.
Figure 21:
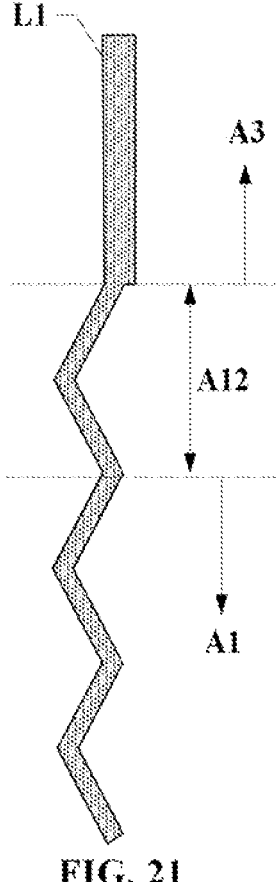
FIG. 21 illustrates a relative position schematic of a part of first-color light-emitting elements and first signal lines in a first display region and a transition region.

FIG. 20 illustrates another top view of the display panel according to various embodiments of the present disclosure. FIG. 21 illustrates a relative position schematic of a part of the first-color light-emitting elements 31 and the first signal lines L1 in the first display region A1 and a transition region A12.

Referring to FIGS. 20-21, the display region 10 may further include the transition region A12 arranged around the first display region A1; and in the transition region A12, the orthographic projection of the first signal line L1 on the plane of the display panel may be at the periphery of the orthographic projection of the anode 301 of the first-color light-emitting element 31 on the plane of the display panel.

Optionally, referring to FIG. 1 and FIG. 2, the binding region A0 may be coincided with the orthographic projection of the first display region A1 on the plane of the display panel. When the drive chip 90 is bound in the binding region A0, a part of the heat generated by the drive chip 90 may be directly transferred to the first display region A1 of the display region 10. Due to heat radiation effect, some heat may be transferred to the transition region A12 on the periphery of the first display region A1. In order to avoid the problem of high heat amount generated in the peripheral region due to heat superposition of the drive chip 90 and the first signal line L1, the line segment of the first signal line L1 in the transition region A12 may be configured in a bypassing manner in embodiments of the present disclosure. FIG. 21 only schematically illustrates the transition region A12 and the first signal line L1 in the first display region A1. The bypassing manner of the first signal line L1 in the transition region A12 may refer to the bypassing manner of the first signal line L1 in the first display region A1 in FIG. 19. In such way, the first signal line L1 may be prevented from passing through the first-color light-emitting element 31 in the transition region A12, that is, the case that the first signal line L1 is located directly below the first-color light-emitting element 31 in the transition region A12 may be avoided, thereby being beneficial for reducing the heat of the first signal line L1 acting on the light-emitting layer 302 of the first-color light-emitting element 31. Even when a part of the heat generated by the drive chip 90 acts on the light-emitting layer 302 of the first-color light-emitting element 31, the superposition of such part of the heat and the heat of the first signal line L1 may be not sufficient to reach the cleaving temperature of the light-emitting layer 302 of the first-color light-emitting element 31. Therefore, it is beneficial for avoiding the cleaving of the light-emitting layer 302 of the first-color light-emitting element 31 in the transition region A12, thereby being beneficial for avoiding the problem of abnormal display in the transition region A12 due to the cleaving of the light-emitting layer 302.

Referring to FIG. 20, in an optional implementation manner of the present disclosure, the width between the edge of the first display region A1 and the edge of the transition region A12 is D0, where $0 < D0 \leq 0.5$ cm.

In embodiments of the present disclosure, the transition region A12 may be regarded as a certain range that extends outward from the first display region A1, and the region corresponding to such range may be regarded as a region that extends at most 0.5 cm from the edge of the first display region A1. When extending outward from the edge of the first display region A1, the larger the extension range is, the smaller the impact of heat radiation from the drive chip is. In embodiments of the present disclosure, the width between the edge of the first display region A1 and the edge of the transition region A12 may be set to $0 < D0 \leq 0.5$ cm. Considering the region most affected by the heat radiation of the drive chip, the bypassing manner of the first signal line L1 in such part of the region may effectively reduce the influence of the heat in such part of the region on the light-emitting element 30. If $D0 > 0.5$ cm, the influence of the thermal radiation of the drive chip received by such part of the region may be significantly small (almost negligible), so that there is no need to wire the first signal lines L1 using the bypassing manner. In such way, it is beneficial for reducing bypassing lengths of the line segments of the first signal lines L1 and reducing the length difference between the first signal line L1 passing through the first display region A1 and the transition region A12 and the first signal line L1 not passing through the first display region A1 and the transition region A12, thereby improving the signal transmission uniformity of different first signal lines L1.

Referring to FIGS. 20-21, in an optional implementation manner of the present disclosure, the display region 10 may further include a third region A3 located on the periphery of the transition region A12; in the first signal line L1, the linewidths of the line segments in the first display region A1 and the transition region A12 may be equal to each other and may be less than the linewidths of the line segments in the third region A3. It should be noted that the linewidth of the first signal line L1 may refer to the width of the line segment in the first signal line L1 along the direction perpendicular to the extending direction of the line segment in the plane of the display panel.

For example, the third region A3 may be regarded as a region that is less or even negligibly affected by the thermal radiation of the drive chip; the first display region A1 may be regarded as a region greatly affected by the thermal radiation of the drive chip; and the thermal radiation effect of the drive chip on the transition region A12 may be between the thermal radiation effect on the first display region A1 and the third region A3. The first signal line L1 in the third region A3 may be wired in a straight line; and the first signal line L1 in the first display region A1 and the transition region A12 may bypass the edge of the anode of the light-emitting element. In such way, the length differences between the first signal line L1 passing through the first display region A1 and the transition region A12 and other signal lines L1 may be reduced as possible. If the linewidths of the first signal lines L1 in three regions are same, the coupling capacitance between the first signal line L1 and other conductive film layers in the first display region A1 and the transition region A12 may be greater than the coupling capacitance between the first signal line L1 and other conductive film layers in the third region A3. Therefore, in embodiments of the present disclosure, when the linewidths of the line segments located in the first display region A1 and the transition region A12 in the first signal line L1 are set to be equal and less than the linewidths of the line segments located in the third region A3 in the first signal line L1, it is beneficial for reducing the coupling capacitance between the first signal lines L1 and other conductive film layers in the first display region A1 and the transition region A12; and beneficial for balancing the differences in coupling capacitance between line segments located in different regions of the first signal lines L1 and other conductive film layers.

Figure 22:
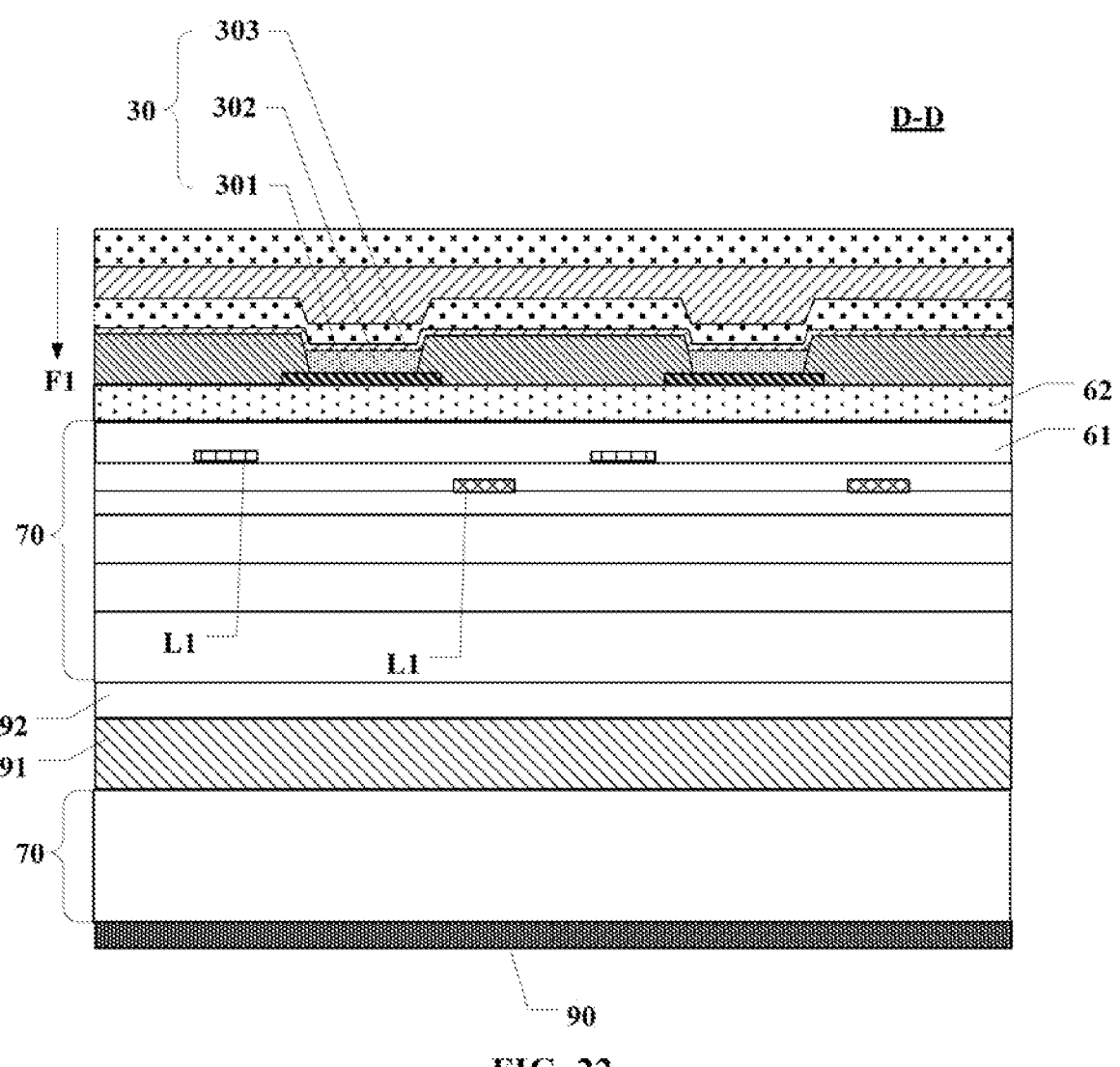
FIG. 22 illustrates another cross-sectional view along a D-D' direction of a display panel in FIG. 1.

FIG. 22 illustrates another cross-sectional view along a D-D' direction of the display panel in FIG. 1. Referring to FIGS. 1 and 22, optionally, the non-light-exiting surface of the display panel may be disposed with a protective film 92; and after the second region 22 is bent to the non-light-exiting surface of the display panel, the film layer structure corresponding to the second region 22 may be attached and fixed with the protective film 92 on the non-light-exiting surface through a composite foam 91. In the display panel, the film layer capable of bending may be assumed to be a bendable layer 70. Optionally, the bendable layer 70 may not include the light-emitting layer and the encapsulation layer. In one embodiment, the film layer structure in FIG. 22, corresponding to the first region A1 in FIGS. 1-2, may illustrate both the bendable layer 70 and the drive chip 90 bent under the protective film 92. It should be noted that FIG. 22 does not show the structure of the bendable layer 70 under the protective film 92; and the structure of the bendable layer 70 may refer to the bendable layer 70 above the protective film 92.

Referring to FIG. 21, in an optional embodiment of the present disclosure, at least in the first display region A1, along the first direction D1, a heat conducting layer 62 may be disposed between the film layer where the anode 301 is located and the film layer where the first signal line L1 is located.

For example, referring to FIGS. 1-2, since the first display region A1 has the problem that the heat of the drive chip 90 is added with the heat of the first signal line L1, in embodiments of the present disclosure, the heat conducting layer 62 may be disposed in the first display region A1 between the film layer where the anode 301 is located and the film layer where the first signal line L1 is located. Optionally, the orthographic projection of the heat conducting layer 62 on the plane where the actual panel is located may cover the first display region A1 and extend to other display regions outside the first display region A1. That is, the area of the heat conducting layer 62 may be larger than the area of the first display region A1. When the heat generated by the drive chip 90 and the heat generated by the first signal line L1 are transferred toward the light-emitting element 30 in the first display region A1, the heat may first pass through the heat conducting layer 62 and be diffused in the heat conducting layer 62. Since the area of the heat conducting layer 62 is larger than the area of the first display region A1, it is equivalent to dissipating heat through the heat conducting layer to a region having larger area than the first display region A1. When same amount of heat is transferred to a region with larger area, the average temperature of different regions on the heat conducting layer 62 may decrease. Even if a part of the heat continues to transmit toward the light-emitting element 30 through the heat conducting layer 62, the heat acting on the light-emitting element 30 may also be reduced. Therefore, by introducing the heat conducting layer 62 between the first signal line L1 and the anode 301, the heat applied to the light-emitting element 30 may be further reduced, which may be more beneficial for avoiding cleaving of the light-emitting layer 302 of the light-emitting element 30 due to high heat amount.

Figure 23:
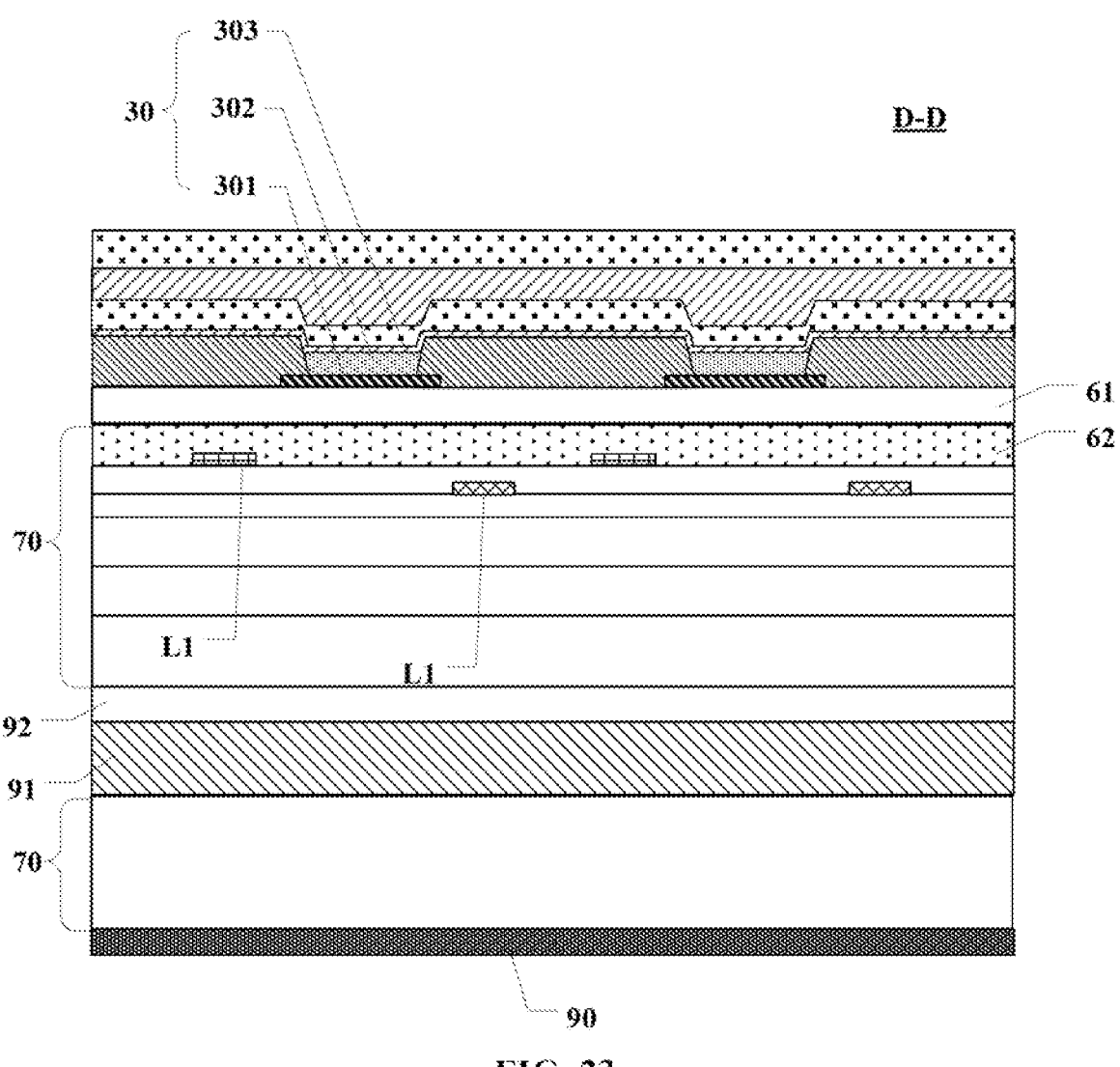
FIG. 23 illustrates another cross-sectional view along a D-D' direction of a display panel in FIG. 1.

FIG. 23 illustrates another cross-sectional view along the D-D' direction of the display panel in FIG. 1. It should be noted that FIG. 23 does not show the structure of the bendable layer 70 under the protective film 92; and the structure of the bendable layer 70 may refer to the bendable layer 70 above the protective film 92.

Referring to FIGS. 22-23, in an optional implementation manner of the present disclosure, along the first direction, a first insulating layer 61 may be disposed between the film layer where the anode 301 is located and the film layer where the first signal line L1 is located. The heat conducting layer 62 may be between the first insulating layer 61 and the film layer where the anode 301 is located; and/or the heat conducting layer 62 may be between the first insulating layer 61 and the film layer where the first signal line L1 is located.

For example, when the first insulating layer 61 is disposed between the anode 301 and the first signal line L1, embodiments shown in FIGS. 22-23 may respectively illustrate the solution of disposing the heat conducting layer 62 between the first insulating layer 61 and the anode 301 and the solution of disposing the heat conducting layer 62 between the first insulating layer 61 and the first signal line L1. In such two solutions, the heat conduction effect of the heat conducting layer 62 may be used to reduce the heat applied to the light-emitting element 30. For the solution of one embodiment shown in FIG. 23, the thermal conducting layer 62 may be disposed closer to the film layer where the first signal line L1 is located. After the heat generated by the drive chip 90 and the heat generated by the first signal line L1 are dissipated by the heat conducting layer 62, the first insulating layer 61 may further dissipate heat because the first insulating layer 61 is also disposed between the heat conducting layer 62 and the light-emitting element 30. Therefore, the heat acting on the light-emitting element 30 may be further reduced, thereby being more beneficial for avoiding cleaving of the light-emitting layer 302 of the light-emitting element 30.

Referring to FIGS. 22-23, in the display panel provided by embodiments of the present disclosure, when the thermal conducting layer 62 is disposed between the film layer where the anode 301 is located and the film layer where the first signal line L1 is located, the heat conducting layer 62 may only be distributed in the first display region A1, but actual size of the heat conducting layer 62 may not be limited. In an optional embodiment of the present disclosure, the orthographic projection of the display region 10 on the plane of the display panel may be within the range of the orthographic projection of the heat conducting layer 62 on the plane of the display panel. That is, the heat conducting layer 62 may be disposed in a corresponding region of entire display region 10, which is equivalent to increasing the coverage area of the heat conducting layer 62. When the heat generated by the first signal line L1 and the drive chip 90 is conducted to the heat conducting layer 62, due to the larger area of the heat conducting layer 62, the heat may be dissipated on the larger area of the heat conducting layer 62. The heat dissipation area may be increased, so that more heat may be dissipated from other regions other than the first display region A1. Therefore, the heat that is further conducted to the light-emitting elements 30 in the first display region A1 through the heat conducting layer 62 may be reduced, which may be more beneficial for reducing the heat acting on the light-emitting elements 30 in the first display region A1 and avoiding abnormal display caused by cleaving of the light-emitting layer 302 of the light-emitting element 30 in the first display region A1.

Optionally, when separate heat conducting layer 62 is introduced into the display panel, the heat conducting layer 62 may include heat conducting materials such as graphite.

Figure 24:
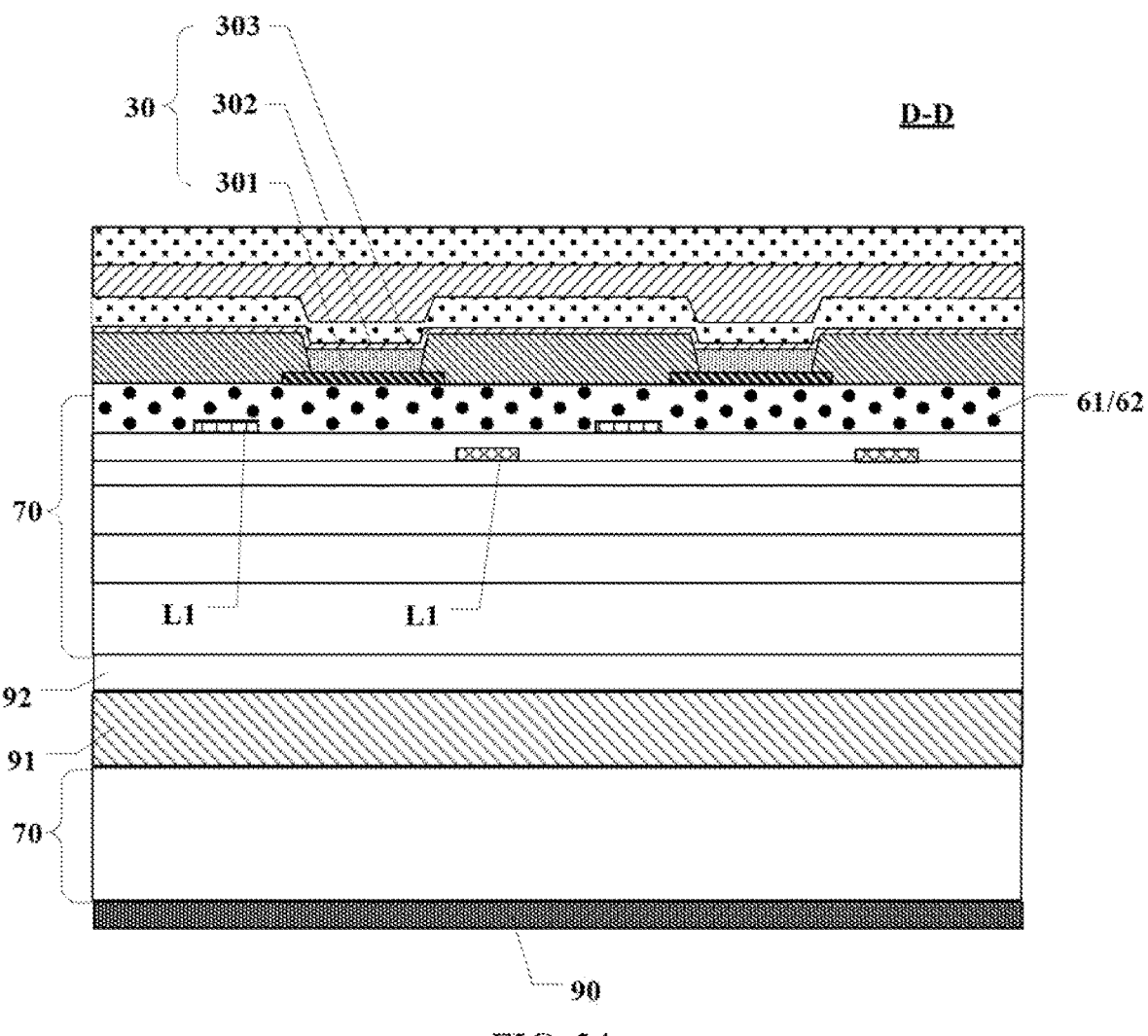
FIG. 24 illustrates another cross-sectional view along a D-D' direction of a display panel in FIG. 1.

FIG. 24 illustrates another cross-sectional view along the D-D' direction of the display panel in FIG. 1. It should be noted that FIG. 24 does not show the structure of the bendable layer 70 under the protective film 92; and the structure of the bendable layer 70 may refer to the bendable layer 70 above the protective film 92.

Referring to FIG. 24, in an optional implementation manner of the present disclosure, along the first direction, the first insulating layer 61 may be included between the film layer where the anode 301 is located and the film layer where the first signal line L1 is located; the first insulating layer 61 may be filled with a heat conducting material; and the first insulating layer 61 may be reused as the heat conducting layer 62.

For example, in one embodiment shown in FIG. 23, it describes a solution that the first insulating layer 61 may be used as the heat conducting layer 62. At this point, the first insulating layer 61 may be filled with a heat conducting material, so that the first insulating layer 61 may have desirable heat conducting performance. When the first insulating layer 61 is reused as the heat conducting layer 62, the first insulating layer 61 may be arranged on entire region corresponding to the display region 10. In such way, there is no need to add a new film layer structure in the display panel as the heat conducting layer 62, which may be beneficial for simplifying the film layer structure of the display panel. Meanwhile, the first insulating layer 61 with a larger area may also increase the heat dissipation area and reduce the heat transferred from the first insulating layer 61 to the light-emitting element 30 in the first display region A1. Therefore, it is also beneficial for avoiding abnormal display caused by cleaving of the light-emitting layer 302 of the light-emitting element 30 in the first display region A1.

Optionally, the thermally conductive material added in the first insulating layer 61 may include graphite and the like.

Figure 25:
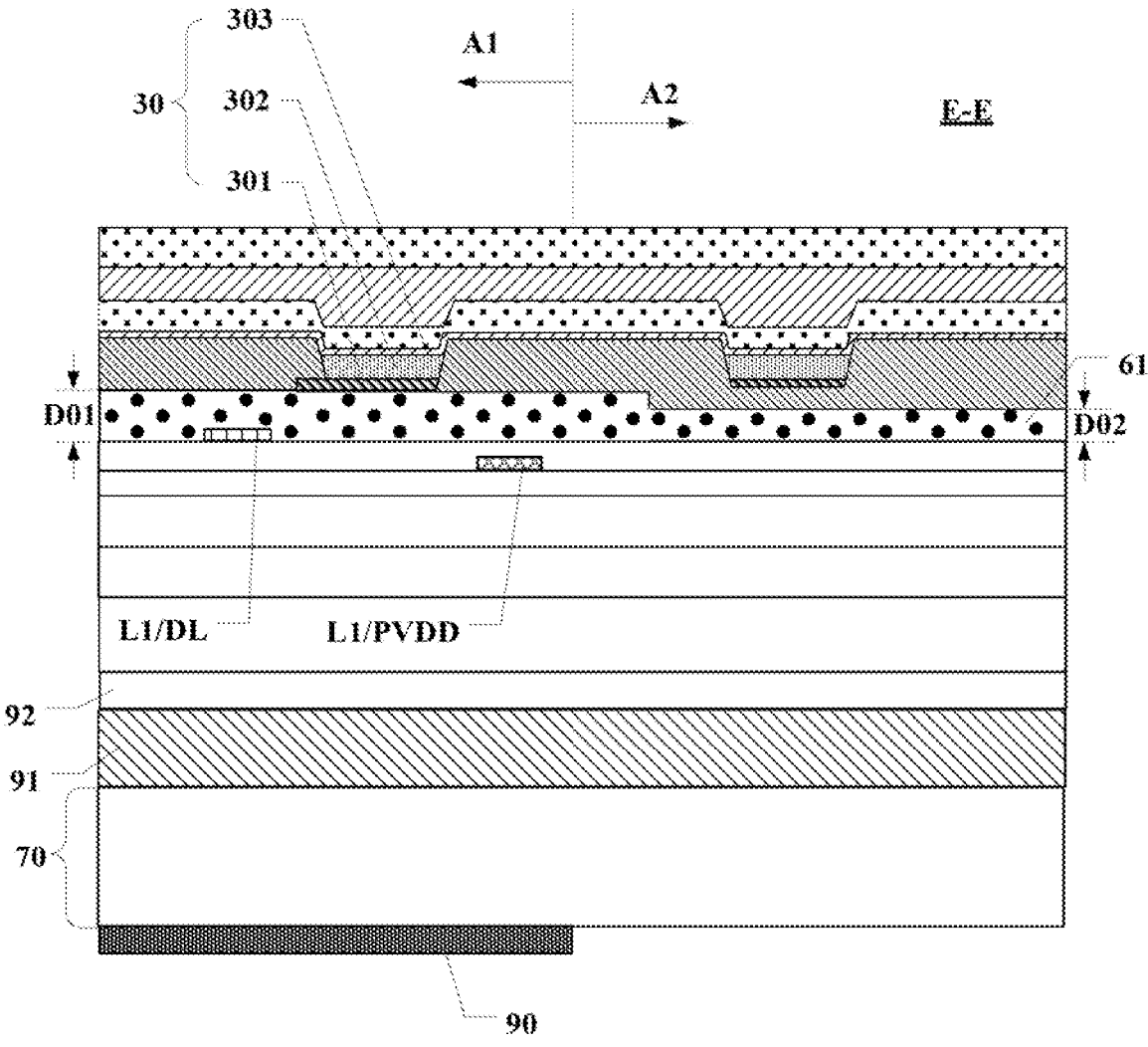
FIG. 25 illustrates a cross-sectional view along an E-E' direction of a display panel in FIG. 1.

FIG. 25 illustrates a cross-sectional view along an E-E' direction of the display panel in FIG. 1. It should be noted that FIG. 25 does not show the structure of the bendable layer 70 under the protective film 92; and the structure of the bendable layer 70 may refer to the bendable layer 70 above the protective film 92.

Referring to FIGS. 1, 2 and 25, in an optional implementation manner of the present disclosure, the display panel may further include the second display region A2 disposed on the periphery of the first display region A1; the thickness of the first insulating layer 61 in the first display region A1 is D01; and the thickness of the first insulating layer 61 in the second display region A2 is D02, where D01≥D02.

In the display panel provided by embodiments of the present disclosure, when the first insulating layer 61 is filled with a thermally conductive material to make the first insulating layer 61 to have desirable thermal conductivity, the thicknesses of the first insulating layer 61 in the first display region A1 and the second display region A2 may be designed differently. For example, since the heat dissipated by the drive chip 90 acts on the first display region A1, the second display region A2 may be less affected. When the thickness D01 of the first insulating layer 61 in the first display region A1 is set to be greater than the thickness D02 of the first insulating layer 61 in the second display region A2, it is beneficial for increasing the heat conduction path of the first insulating layer 61 in the first display region A1. As the heat conduction path increases, the heat may gradually decrease. Therefore, it is beneficial for reducing the heat conduction from the first insulating layer 61 in the first display region A1 to the light-emitting element 30, thereby being beneficial for avoiding the problem of abnormal display caused by cleaving of the light-emitting layer 302 of the light-emitting element 30 in the first display region A1.

It should be noted that, in an actual manufacturing process, the first insulating layer 61 with different thicknesses may be formed by using a half-tone masking process.

Figure 26:
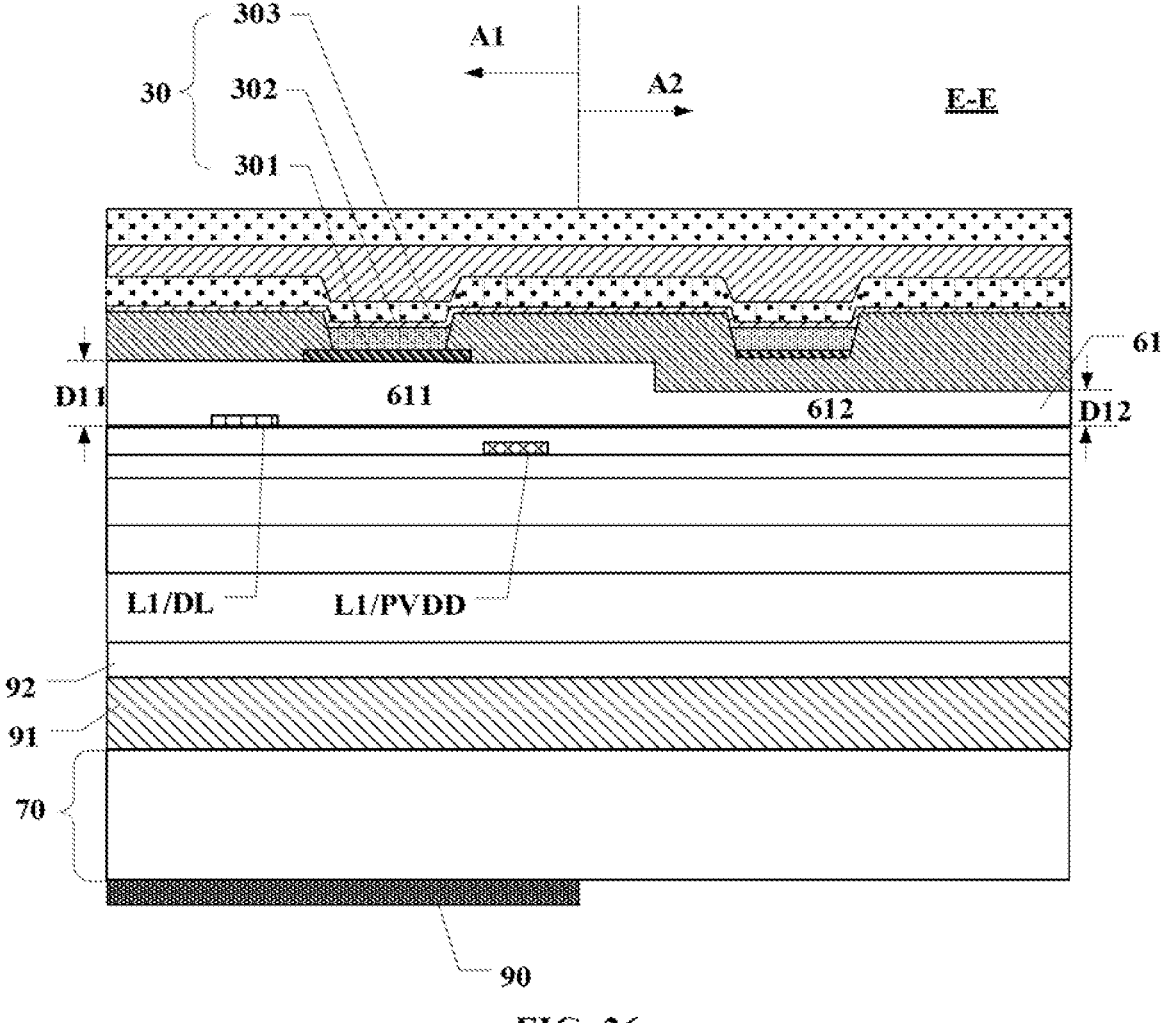
FIG. 26 illustrates another cross-sectional view along an E-E' direction of a display panel in FIG. 1.

FIG. 26 illustrates another cross-sectional view along the E-E' direction of the display panel in FIG. 1. It should be noted that FIG. 26 does not show the structure of the bendable layer 70 under the protective film 92; and the structure of the bendable layer 70 may refer to the bendable layer 70 above the protective film 92.

Referring to FIG. 26, in an optional implementation manner of the present disclosure, along the first direction, the first insulating layer 61 may be included between the film layer where the anode 301 is located and the film layer where the first signal line L1 is located; the display panel may further include the second display region A2 arranged on the periphery of the first display region A1; the first insulating layer 61 may include a first sub-insulating layer 611 located in the first display region A1 and a second sub-insulating layer 612 located in the second display region A2; and the thickness of the first sub-insulating layer 611 is D11, and the thickness of the second sub-insulating layer 612 is D12, where D11>D12.

In one embodiment of FIG. 26, it describes the solution that a special heat conducting layer 62 is not disposed between the film layer of the anode 301 and the first signal line L1, and the first insulating layer 61 is used to conduct heat. Referring to FIGS. 1, 2 and 26, for example, in the first insulation layer 61 of embodiments of the present disclosure, the thickness D11 of the first sub-insulating layer 611 in the first display region A1 may be set to be greater than the thickness D12 of the second sub-insulating layer 612 in the second display region A2, which may be equivalent to increasing the heat conduction path in the first sub-insulating layer 611 in the first display region A1. As the heat conduction path increases, the heat may gradually decrease. Therefore, it is beneficial for reducing the heat conducted from the first sub-insulating layer 611 in the first display region A1 to the light-emitting element 30, thereby being beneficial for avoiding the problem of abnormal display caused by cleaving of the light-emitting layer 302 of the light-emitting element 30 in the first display region A1.

It should be noted that, in an actual manufacturing process, the first insulating layer 61 with different thicknesses may be formed by using a half-tone masking process.

Figure 27:
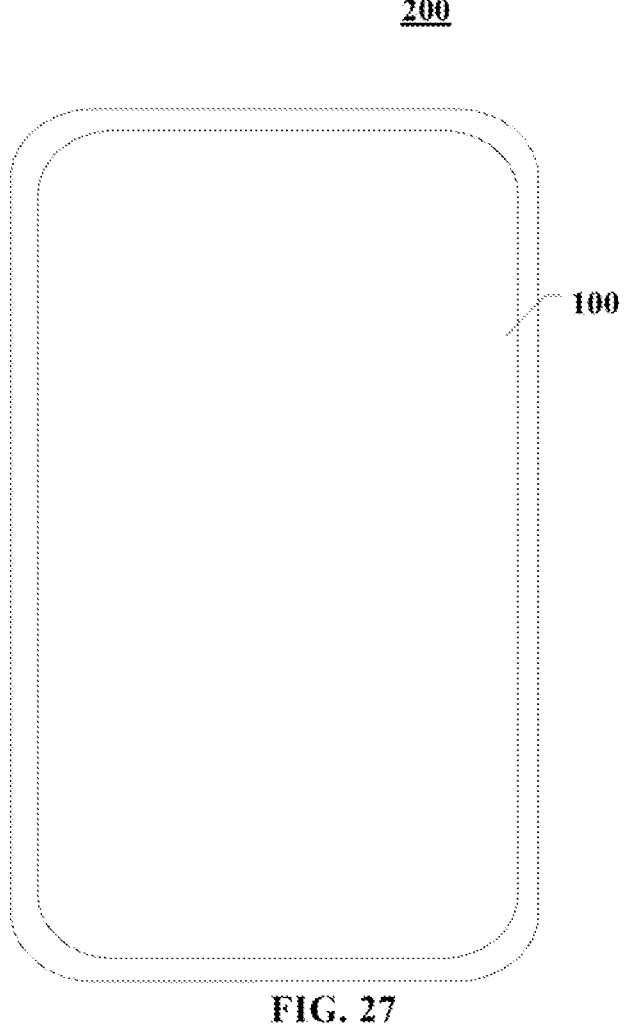
FIG. 27 illustrates a structural schematic of a display apparatus according to various embodiments of the present disclosure.

Based on a same inventive concept, the present disclosure also provides a display apparatus 200. FIG. 27 illustrates a structural schematic of the display apparatus according to various embodiments of the present disclosure. Referring to FIG. 27, the display apparatus 200 may include the display panel 100 provided by above-mentioned embodiments of the present disclosure.

It may be understood that the display apparatus provided in embodiments of the present disclosure may be a computer, a mobile phone, a tablet and other display devices with a display function and may be a display apparatus especially suitable for a wide-screen structure such as a vehicle-mounted display device and the like, which may not be limited in the present disclosure.

The display apparatus provided in embodiments of the present disclosure may have the beneficial effect of the display panel provided in embodiments of the present disclosure, which may refer to the description of the display panel in above-mentioned embodiments for details and may not be described in detail in one embodiment.

From above-mentioned embodiments, it may be seen that the display panel and the display apparatus provided by the present disclosure may achieve at least following beneficial effects.

In the display panel and the display apparatus provided by the present disclosure, the second region in the non-display region may be bent to the non-light-exiting surface of the display region through the bending region, such that the binding region on the second region may be at least partially overlapped with the first display region on the display region. Optionally, the binding region may be bound with the drive chip. The sub-pixels in the display panel may include the pixel circuits and light-emitting elements which are electrically connected with each other. The first signal lines may be electrically connected to the pixel circuits for providing signals to the pixel circuits. The light-emitting element may include the first-color light-emitting element. At least in the first display region, the orthographic projection of the first signal line on the plane of the display panel may be at the periphery of the orthographic projection of the anode of the first-color light-emitting element on the plane of the display panel. In the existing technology, when the first signal line does not bypass the first-color light-emitting element, the heat generated by the first-color light-emitting element may be superimposed on the heat generated by the drive chip to act on the first-color light-emitting element, and the light-emitting material in the first-color light-emitting element may be highly likely to be cleaved. However, in the present disclosure, the first signal line may be arranged on the periphery of the first-color light-emitting element in the first display region. In such way, even if the first signal line generates relatively large heat, the heat may not directly act on the first-color light-emitting element. Compared with the existing technology, the heat applied to the first-color light-emitting element may be reduced, thereby being beneficial for reducing the possibility of cleaving the light-emitting material of the first-color light-emitting element and avoiding the display and service life effect after the cleaving of the light-emitting material.

Although some embodiments of the present disclosure have been described in detail through various embodiments, those skilled in the art should understand that above embodiments may be for illustration only and may not be intended to limit the scope of the present disclosure. Those skilled in the art should understood that modifications may be made to above embodiments without departing from the scope and spirit of the present disclosure. The scope of the present disclosure may be defined by the appended claims.

What is claimed is:

1. A display panel, comprising:
a display region and a non-display region, wherein:
the non-display region includes a first region, a bending region and a second region which are on a same side of the display region; the bending region is between the first region and the second region; the second region includes a binding region; the display region includes a first display region; along a first direction, the binding region is at least partially overlapped with the first display region; and the first direction is a thickness direction of the display panel;
a plurality of sub-pixels, including pixel circuits and light-emitting elements which are electrically connected to each other; and

22 first signal lines electrically connected to the pixel circuits, wherein:
a light-emitting element includes an anode, a light-emitting layer, and a cathode which are arranged along the first direction; the light-emitting elements include a first-color light-emitting element; and at least in the first display region, an orthographic projection of a first signal line on a plane of the display panel is at a periphery of an orthographic projection of an anode of the first-color light-emitting element on the plane of the display panel; and
in the first display region, the first signal line includes a plurality of sub-line segments connected end-to-end; and at least a part of the plurality of sub-line segments is wired along a contour of the anode of the first-color light-emitting element.

2. The display panel according to claim 1, further including:
a data line and a first power signal line, wherein the first signal lines include at least one of the data line and the first power signal line.

3. The display panel according to claim 2, wherein:
in the first display region, the data line and the first power signal line are arranged in different layers.

4. The display panel according to claim 3, further including:
a substrate; and
a first metal layer, a capacitor metal layer, a second metal layer, and a third metal layer which are disposed on a side of the substrate, wherein:
along the first direction, the capacitor metal layer is on a side of the first metal layer away from the substrate; the second metal layer is on a side of the capacitor metal layer away from the substrate; and the third metal layer is between the second metal layer and the light-emitting element; and
the data line is in one layer of the second metal layer, the capacitor metal layer and the third metal layer; and the first power signal line is in another layer of the second metal layer, the capacitor metal layer and the third metal layer.

5. A display panel, comprising:
a display region and a non-display region, wherein:
the non-display region includes a first region, a bending region and a second region which are on a same side of the display region; the bending region is between the first region and the second region; the second region includes a binding region; the display region includes a first display region; along a first direction, the binding region is at least partially overlapped with the first display region; and the first direction is a thickness direction of the display panel;
a plurality of sub-pixels, including pixel circuits and light-emitting elements which are electrically connected to each other; and
first signal lines electrically connected to the pixel circuits, wherein:
a light-emitting element includes an anode, a light-emitting layer, and a cathode which are arranged along the first direction; the light-emitting elements include a first-color light-emitting element; and at least in the first display region, an orthographic projection of a first signal line on a plane of the display panel is at a periphery of an orthographic projection of an anode of the first-color light-emitting element on the plane of the display panel; and the display region further includes a second display region, configured at a periphery of the first display region, wherein the first signal lines include a first line segment in the first display region and a second line segment in the second display region; and a linewidth of the first line segment is less than a linewidth of the second line segment.

6. The display panel according to claim 1, further including:
a substrate;
a first metal layer, a capacitor metal layer, a second metal layer, a third metal layer and a fourth metal layer which are disposed on a side of the substrate, wherein along the first direction, the capacitor metal layer is on a side of the first metal layer away from the substrate; the second metal layer is on a side of the capacitor metal layer away from the substrate; the third metal layer is between the second metal layer and the fourth metal layer; and the fourth metal layer is on a side of the light-emitting element facing the substrate; and
a plurality of second signal lines in the fourth metal layer, wherein at least a part of the plurality of second signal lines is in the first display region; and in the first display region, an orthographic projection of a second signal line on the plane of the display panel is at the periphery of the orthographic projection of the anode of the first-color light-emitting element on the plane of the display panel.

7. The display panel according to claim 6, wherein:
the display region includes a first display region and a second display region, wherein the second display region is on at least one side of the first display region along a second direction; both the first display region and the second display region include a plurality of data lines extending along a third direction and arranged along the second direction; and the second direction intersects the third direction;
the non-display region includes a plurality of fan-out wirings, wherein the plurality of data lines is electrically connected to the plurality of fan-out wirings; and a data line in the second display region is electrically connected to a fan-out wiring through a connection wiring; and
the plurality of second signal lines includes the connection wiring.

8. The display panel according to claim 1, wherein:
the light-emitting elements further include a second-color light-emitting element and a third-color light-emitting element, wherein a cleaving temperature of a material of a light-emitting layer in the first-color light-emitting element is T1, a cleaving temperature of a material of a light-emitting layer in the second-color light-emitting element is T2, and a cleaving temperature of a material of a light-emitting layer in the third-color light-emitting element is T3, wherein T1<T2, and T1<T3.

9. The display panel according to claim 8, wherein:
T2<T3; and in the first display region, an orthographic projection of the first signal line on the plane of the display panel is at a periphery of an orthographic projection of an anode of the second-color light-emitting element on the plane of the display panel.

10. The display panel according to claim 8, wherein:
in the first display region, along the first direction, the first signal line is not overlapped with each of the first-color light-emitting element, the second-color light-emitting element and the third-color light-emitting element.

11. The display panel according to claim 1, wherein:
the display region further includes a transition region around the first display region; and in the transition region, the orthographic projection of the first signal line on the plane of the display panel is at the periphery of the orthographic projection of the anode of the first-color light-emitting element on the plane of the display panel.

12. The display panel according to claim 11, wherein:
the display region further includes a third region on a periphery of the transition region; in the first signal lines, linewidths of line segments in the first display region and the transition region are equal to each other and all less than linewidths of line segments in the third region.

13. The display panel according to claim 1, wherein:
at least in the first display region, along the first direction, a heat conducting layer is disposed between a film layer of the anode and a film layer of the first signal line.

14. The display panel according to claim 13, wherein:
along the first direction, a first insulating layer is disposed between the film layer of the anode and the film layer of the first signal line; the heat conducting layer is between the first insulating layer and the film layer of the anode; and/or the heat conducting layer is between the first insulating layer and the film layer of the first signal line.

15. The display panel according to claim 14, wherein:
an orthographic projection of the display region on the plane of the display panel is within a range of an orthographic projection of the heat conducting layer on the plane of the display panel.

16. The display panel according to claim 13, wherein:
along the first direction, the first insulating layer is disposed between the film layer of the anode and the film layer of the first signal line; and the first insulating layer is filled with a heat conducting material and reused as the heat conducting layer; and/or
the display panel further includes a second display region, configured at a periphery of the first display region, wherein a thickness of the first insulating layer in the first display region is D01, and a thickness of the first insulating layer in the second display region is D02, wherein D01≥D02.

17. The display panel according to claim 1, wherein:
along the first direction, a first insulating layer is disposed between a film layer of the anode and a film layer of the first signal line; and the display panel further includes a second display region configured at a periphery of the first display region; and
the first insulating layer includes a first sub-insulating layer in the first display region and a second sub-insulating layer in the second display region; and a thickness of the first sub-insulating layer is D11, and a thickness of the second sub-insulating layer is D12, wherein D11>D12.

18. A display apparatus, comprising:
a display panel, comprising:
a display region and a non-display region, wherein:
the non-display region includes a first region, a bending region and a second region which are on a same side of the display region; the bending region is between the first region and the second region; the second region includes a binding region; the display region includes a first display region; along a first direction, the binding region is at least partially overlapped with the first display region; and the first direction is a thickness direction of the display panel;

a plurality of sub-pixels, including pixel circuits and light-emitting elements which are electrically connected to each other; and first signal lines electrically connected to the pixel circuits, wherein:

a light-emitting element includes an anode, a light-emitting layer, and a cathode which are arranged along the first direction; the light-emitting elements include a first-color light-emitting element; and at least in the first display region, an orthographic projection of a first signal line on a plane of the display panel is at a periphery of an orthographic projection of an anode of the first-color light-emitting element on the plane of the display panel; and in the first display region, the first signal line includes a plurality of sub-line segments connected end-to-end; and at least a part of the plurality of sub-line segments is wired along a contour of the anode of the first-color light-emitting element.

* * * * *